United States Patent
Langdo et al.

(10) Patent No.: US 7,297,612 B2
(45) Date of Patent: Nov. 20, 2007

(54) METHODS FOR FORMING STRAINED-SEMICONDUCTOR-ON-INSULATOR DEVICE STRUCTURES BY USE OF CLEAVE PLANES

(75) Inventors: Thomas A. Langdo, Cambridge, MA (US); Matthew T. Currie, Brookline, MA (US); Richard Hammond, Harriseahead (GB); Anthony J. Lochtefeld, Somerville, MA (US); Eugene A. Fitzgerald, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 199 days.

(21) Appl. No.: 11/127,508

(22) Filed: May 12, 2005

(65) Prior Publication Data

US 2005/0212061 A1    Sep. 29, 2005

Related U.S. Application Data

(62) Division of application No. 10/456,103, filed on Jun. 6, 2003, now Pat. No. 6,995,430.

(60) Provisional application No. 60/386,968, filed on Jun. 7, 2002, provisional application No. 60/404,058, filed on Aug. 15, 2002, provisional application No. 60/416,000, filed on Oct. 4, 2002.

(51) Int. Cl.
    *H01L 21/30* (2006.01)

(52) U.S. Cl. .................. 438/458; 257/E21.567; 257/E21.57; 438/455; 438/459

(58) Field of Classification Search ........ 257/E21.567, 257/E21.57; 438/455, 458
See application file for complete search history.

(56) References Cited

U.S. PATENT DOCUMENTS

| | | | |
|---|---|---|---|
| 4,010,045 A | 3/1977 | Ruehrwein |
| 4,704,302 A | 11/1987 | Bruel et al. |
| 4,710,788 A | 12/1987 | Dämbkes et al. |
| 4,969,031 A | 11/1990 | Kobayashi et al. |
| 4,987,462 A | 1/1991 | Kim et al. |
| 4,990,979 A | 2/1991 | Otto |
| 4,997,776 A | 3/1991 | Harame et al. |
| 5,013,681 A | 5/1991 | Godbey et al. |
| 5,089,872 A | 2/1992 | Ozturk et al. |

(Continued)

FOREIGN PATENT DOCUMENTS

DE    41 01 167    7/1992

(Continued)

OTHER PUBLICATIONS

"2 Bit/Cell EEPROM Cell Using Band to Band Tunneling for Data Read-Out," IBM Technical Disclosure Bulletin, vol. 35, No. 4B (Sep. 1992) pp. 136-140.

(Continued)

*Primary Examiner*—Asok Kumar Sarkar
(74) *Attorney, Agent, or Firm*—Goodwin Procter LLP

(57) ABSTRACT

The benefits of strained semiconductors are combined with silicon-on-insulator approaches to substrate and device fabrication.

16 Claims, 23 Drawing Sheets

U.S. PATENT DOCUMENTS

| | | |
|---|---|---|
| 5,091,767 A | 2/1992 | Bean et al. |
| 5,155,571 A | 10/1992 | Wang et al. |
| 5,166,084 A | 11/1992 | Pfiester |
| 5,177,583 A | 1/1993 | Endo et al. |
| 5,202,284 A | 4/1993 | Kamins et al. |
| 5,207,864 A | 5/1993 | Bhat et al. |
| 5,208,182 A | 5/1993 | Narayan et al. |
| 5,212,110 A | 5/1993 | Pfiester et al. |
| 5,221,413 A | 6/1993 | Brasen et al. |
| 5,240,876 A | 8/1993 | Gaul et al. |
| 5,241,197 A | 8/1993 | Murakami et al. |
| 5,242,847 A | 9/1993 | Ozturk et al. |
| 5,250,445 A | 10/1993 | Bean et al. |
| 5,285,086 A | 2/1994 | Fitzgerald |
| 5,291,439 A | 3/1994 | Kauffmann et al. |
| 5,298,452 A | 3/1994 | Meyerson |
| 5,310,451 A | 5/1994 | Tejwani et al. |
| 5,316,958 A | 5/1994 | Meyerson |
| 5,346,848 A | 9/1994 | Grupen-Shemansky et al. |
| 5,374,564 A | 12/1994 | Bruel |
| 5,399,522 A | 3/1995 | Ohori |
| 5,405,802 A * | 4/1995 | Yamagata et al. .......... 438/459 |
| 5,413,679 A | 5/1995 | Godbey |
| 5,424,243 A | 6/1995 | Takasaki |
| 5,426,069 A | 6/1995 | Selvakumar et al. |
| 5,426,316 A | 6/1995 | Mohammad |
| 5,439,843 A | 8/1995 | Sakaguchi et al. |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse |
| 5,479,033 A | 12/1995 | Baca et al. |
| 5,484,664 A | 1/1996 | Kitahara et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,548,128 A | 8/1996 | Soref et al. |
| 5,572,043 A | 11/1996 | Shimizu et al. |
| 5,596,527 A | 1/1997 | Tomioka et al. |
| 5,607,876 A | 3/1997 | Biegelsen et al. |
| 5,617,351 A | 4/1997 | Bertin et al. |
| 5,630,905 A | 5/1997 | Lynch et al. |
| 5,659,187 A | 8/1997 | Legoues et al. |
| 5,683,934 A | 11/1997 | Candelaria |
| 5,698,869 A | 12/1997 | Yoshimi et al. |
| 5,705,421 A | 1/1998 | Matsushita et al. |
| 5,714,777 A | 2/1998 | Ismail et al. |
| 5,728,623 A | 3/1998 | Mori |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato |
| 5,808,344 A | 9/1998 | Ismail et al. |
| 5,821,577 A | 10/1998 | Crabbé et al. |
| 5,847,419 A | 12/1998 | Imai et al. |
| 5,863,830 A | 1/1999 | Bruel et al. |
| 5,877,070 A | 3/1999 | Goesele et al. |
| 5,882,987 A | 3/1999 | Srikrishnan |
| 5,891,769 A | 4/1999 | Hong et al. |
| 5,906,708 A | 5/1999 | Robinson et al. |
| 5,906,951 A | 5/1999 | Chu et al. |
| 5,912,479 A | 6/1999 | Mori et al. |
| 5,923,046 A | 7/1999 | Tezuka et al. |
| 5,943,560 A | 8/1999 | Chang et al. |
| 5,963,817 A | 10/1999 | Chu et al. |
| 5,966,622 A | 10/1999 | Levine et al. |
| 5,993,677 A | 11/1999 | Biasse et al. |
| 5,998,807 A | 12/1999 | Lustig et al. |
| 6,013,134 A | 1/2000 | Chu et al. |
| 6,013,553 A | 1/2000 | Wallace et al. |
| 6,013,563 A | 1/2000 | Henley et al. |
| 6,020,252 A | 2/2000 | Aspar et al. |
| 6,033,974 A | 3/2000 | Henley et al. |
| 6,033,995 A | 3/2000 | Muller |
| 6,058,044 A | 5/2000 | Sugiura et al. |
| 6,059,895 A | 5/2000 | Chu et al. |
| 6,074,919 A | 6/2000 | Gardner et al. |
| 6,096,590 A | 8/2000 | Chan et al. |
| 6,103,559 A | 8/2000 | Gardner et al. |
| 6,103,597 A | 8/2000 | Aspar et al. |
| 6,103,599 A | 8/2000 | Henley et al. |
| 6,107,653 A | 8/2000 | Fitzgerald |
| 6,111,267 A | 8/2000 | Fischer et al. |
| 6,117,750 A | 9/2000 | Bensahel et al. |
| 6,130,453 A | 10/2000 | Mei et al. |
| 6,133,799 A | 10/2000 | Favors, Jr. et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,160,303 A | 12/2000 | Fattaruso |
| 6,162,688 A | 12/2000 | Gardner et al. |
| 6,162,705 A | 12/2000 | Henley et al. |
| 6,184,111 B1 | 2/2001 | Henley et al. |
| 6,190,998 B1 | 2/2001 | Bruel et al. |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto |
| 6,210,988 B1 | 4/2001 | Howe et al. |
| 6,218,677 B1 | 4/2001 | Broekaert |
| 6,225,192 B1 | 5/2001 | Aspar et al. |
| 6,228,694 B1 | 5/2001 | Doyle et al. |
| 6,232,138 B1 | 5/2001 | Fitzgerald et al. |
| 6,235,567 B1 | 5/2001 | Huang |
| 6,235,568 B1 | 5/2001 | Murthy et al. |
| 6,242,324 B1 | 6/2001 | Kub et al. |
| 6,249,022 B1 | 6/2001 | Lin et al. |
| 6,251,751 B1 | 6/2001 | Chu et al. |
| 6,251,755 B1 | 6/2001 | Furukawa et al. |
| 6,261,929 B1 | 7/2001 | Gehrke et al. |
| 6,266,278 B1 | 7/2001 | Harari et al. |
| 6,271,551 B1 | 8/2001 | Schmitz et al. |
| 6,271,726 B1 | 8/2001 | Fransis et al. |
| 6,281,532 B1 | 8/2001 | Doyle et al. |
| 6,290,804 B1 | 9/2001 | Henley et al. |
| 6,291,321 B1 | 9/2001 | Fitzgerald |
| 6,303,468 B1 | 10/2001 | Aspar et al. |
| 6,313,016 B1 | 11/2001 | Kibbel et al. |
| 6,316,301 B1 | 11/2001 | Kant |
| 6,323,108 B1 | 11/2001 | Kub et al. |
| 6,326,664 B1 | 12/2001 | Chau et al. |
| 6,326,667 B1 | 12/2001 | Sugiyama et al. |
| 6,329,063 B2 | 12/2001 | Lo et al. |
| 6,335,546 B1 | 1/2002 | Tsuda et al. |
| 6,339,232 B1 | 1/2002 | Takagi |
| 6,344,417 B1 | 2/2002 | Usenko |
| 6,346,459 B1 | 2/2002 | Usenko et al. |
| 6,350,311 B1 | 2/2002 | Chin et al. |
| 6,350,993 B1 | 2/2002 | Chu et al. |
| 6,352,909 B1 | 3/2002 | Usenko |
| 6,355,493 B1 | 3/2002 | Usenko |
| 6,368,733 B1 | 4/2002 | Nishinaga |
| 6,368,938 B1 | 4/2002 | Usenko |
| 6,369,438 B1 | 4/2002 | Sugiyama et al. |
| 6,372,356 B1 | 4/2002 | Thornton et al. |
| 6,372,593 B1 | 4/2002 | Hattori et al. |
| 6,372,609 B1 | 4/2002 | Aga et al. |

| Patent | Date | Inventor |
|---|---|---|
| 6,387,829 B1 | 5/2002 | Usenko et al. |
| 6,391,740 B1 | 5/2002 | Cheung et al. |
| 6,399,970 B2 | 6/2002 | Kubo et al. |
| 6,403,975 B1 | 6/2002 | Brunner et al. |
| 6,407,406 B1 | 6/2002 | Tezuka |
| 6,410,371 B1 | 6/2002 | Yu et al. |
| 6,420,937 B1 | 7/2002 | Akatsuka et al. |
| 6,425,951 B1 | 7/2002 | Chu et al. |
| 6,429,061 B1 | 8/2002 | Rim |
| 6,445,016 B1 | 9/2002 | An et al. |
| 6,448,152 B1 | 9/2002 | Henley et al. |
| 6,455,397 B1 | 9/2002 | Belford |
| 6,458,672 B1 | 10/2002 | Henley et al. |
| 6,475,072 B1 | 11/2002 | Canaperi et al. |
| 6,489,639 B1 | 12/2002 | Hoke et al. |
| 6,500,694 B1 | 12/2002 | Enquist |
| 6,514,836 B2 | 2/2003 | Belford |
| 6,515,335 B1 | 2/2003 | Christiansen et al. |
| 6,521,041 B2 | 2/2003 | Wu et al. |
| 6,524,935 B1 | 2/2003 | Canaperi et al. |
| 6,534,380 B1 | 3/2003 | Yamauchi et al. |
| 6,534,381 B2 | 3/2003 | Cheung et al. |
| 6,555,839 B2 | 4/2003 | Fitzgerald et al. |
| 6,563,152 B2 | 5/2003 | Roberds et al. |
| 6,573,126 B2 | 6/2003 | Cheng et al. |
| 6,583,015 B2 | 6/2003 | Fitzgerald et al. |
| 6,583,437 B2 | 6/2003 | Mizuno et al. |
| 6,591,321 B1 | 7/2003 | Arimilli et al. |
| 6,593,191 B2 | 7/2003 | Fitzgerald |
| 6,593,625 B2 | 7/2003 | Christiansen et al. |
| 6,596,610 B1 | 7/2003 | Kuwabara et al. |
| 6,597,016 B1 | 7/2003 | Yuki et al. |
| 6,602,613 B1 | 8/2003 | Fitzgerald |
| 6,605,498 B1 | 8/2003 | Murthy et al. |
| 6,607,948 B1 | 8/2003 | Sugiyama et al. |
| 6,621,131 B2 | 9/2003 | Murthy et al. |
| 6,624,047 B1 | 9/2003 | Sakaguchi et al. |
| 6,624,478 B2 | 9/2003 | Anderson et al. |
| 6,632,724 B2 | 10/2003 | Henley et al. |
| 6,635,909 B2 | 10/2003 | Clark et al. |
| 6,645,831 B1 | 11/2003 | Shaheen et al. |
| 6,646,322 B2 | 11/2003 | Fitzgerald |
| 6,649,480 B2 | 11/2003 | Fitzgerald et al. |
| 6,649,492 B2 | 11/2003 | Chu et al. |
| 6,656,271 B2 | 12/2003 | Yonehara et al. |
| 6,657,223 B1 | 12/2003 | Wang et al. |
| 6,664,169 B1 | 12/2003 | Iwasaki et al. |
| 6,674,150 B2 | 1/2004 | Takagi et al. |
| 6,677,183 B2 | 1/2004 | Sakaguchi et al. |
| 6,677,192 B1 | 1/2004 | Fitzgerald |
| 6,680,240 B1 | 1/2004 | Maszara |
| 6,680,260 B2 | 1/2004 | Akiyama et al. |
| 6,690,043 B1 | 2/2004 | Usuda et al. |
| 6,703,144 B2 | 3/2004 | Fitzgerald |
| 6,703,648 B1 | 3/2004 | Xiang et al. |
| 6,703,688 B1 | 3/2004 | Fitzergald |
| 6,706,614 B1 | 3/2004 | An et al. |
| 6,706,618 B2 | 3/2004 | Takisawa et al. |
| 6,707,106 B1 | 3/2004 | Wristers et al. |
| 6,709,903 B2 | 3/2004 | Christiansen et al. |
| 6,709,909 B2 | 3/2004 | Mizuno et al. |
| 6,713,326 B2 | 3/2004 | Cheng et al. |
| 6,723,661 B2 | 4/2004 | Fitzergald |
| 6,724,008 B2 | 4/2004 | Fitzergald |
| 6,730,551 B2 | 5/2004 | Lee et al. |
| 6,737,670 B2 | 5/2004 | Cheng et al. |
| 6,743,684 B2 | 6/2004 | Liu |
| 6,750,130 B1 | 6/2004 | Fitzgerald |
| 6,774,010 B2 * | 8/2004 | Chu et al. .................. 438/458 |
| 6,790,747 B2 | 9/2004 | Henley et al. |
| 6,828,214 B2 | 12/2004 | Notsu et al. |
| 6,830,976 B2 | 12/2004 | Fitzgerald |
| 6,876,010 B1 | 4/2005 | Fitzgerald |
| 6,881,632 B2 | 4/2005 | Fitzgerald et al. |
| 6,890,835 B1 | 5/2005 | Chu et al. |
| 6,921,914 B2 | 7/2005 | Cheng et al. |
| 7,091,095 B2 | 8/2006 | Chu |
| 2001/0003364 A1 | 6/2001 | Sugawara et al. |
| 2001/0007789 A1 | 7/2001 | Aspar et al. |
| 2002/0043660 A1 | 4/2002 | Yamazaki et al. |
| 2002/0063292 A1 | 5/2002 | Armstrong et al. |
| 2002/0084000 A1 | 7/2002 | Fitzgerald |
| 2002/0096717 A1 | 7/2002 | Chu et al. |
| 2002/0100942 A1 | 8/2002 | Fitzgerald et al. |
| 2002/0123167 A1 | 9/2002 | Fitzgerald et al. |
| 2002/0123183 A1 | 9/2002 | Fitzgerald |
| 2002/0125471 A1 | 9/2002 | Fitzgerald et al. |
| 2002/0140031 A1 | 10/2002 | Rim |
| 2002/0167048 A1 | 11/2002 | Tweet et al. |
| 2002/0168864 A1 | 11/2002 | Cheng et al. |
| 2002/0190284 A1 | 12/2002 | Murthy et al. |
| 2003/0003679 A1 | 1/2003 | Doyle et al. |
| 2003/0013305 A1 | 1/2003 | Sugii et al. |
| 2003/0013323 A1 | 1/2003 | Hammond et al. |
| 2003/0027381 A1 | 2/2003 | Buynoski et al. |
| 2003/0034529 A1 | 2/2003 | Fitzgerald et al. |
| 2003/0057439 A1 | 3/2003 | Fitzgerald |
| 2003/0077867 A1 | 4/2003 | Fitzgerald |
| 2003/0080361 A1 | 5/2003 | Murthy et al. |
| 2003/0102498 A1 | 6/2003 | Braithwaite et al. |
| 2003/0119280 A1 | 6/2003 | Lee et al. |
| 2003/0127646 A1 | 7/2003 | Christiansen et al. |
| 2003/0139000 A1 | 7/2003 | Bedell et al. |
| 2003/0141548 A1 | 7/2003 | Anderson et al. |
| 2003/0157787 A1 | 8/2003 | Murthy et al. |
| 2003/0160300 A1 | 8/2003 | Takenaka et al. |
| 2003/0178681 A1 | 9/2003 | Clark et al. |
| 2003/0189229 A1 | 10/2003 | Mouli |
| 2003/0199126 A1 | 10/2003 | Chu et al. |
| 2003/0201458 A1 | 10/2003 | Clark et al. |
| 2003/0203600 A1 | 10/2003 | Chu et al. |
| 2003/0207127 A1 | 11/2003 | Murthy et al. |
| 2003/0215990 A1 | 11/2003 | Fitzgerald et al. |
| 2003/0218189 A1 | 11/2003 | Christiansen et al. |
| 2003/0219957 A1 | 11/2003 | Kuwabara et al. |
| 2003/0227036 A1 | 12/2003 | Sugiyama et al. |
| 2003/0227057 A1 | 12/2003 | Lochtefeld et al. |
| 2003/0230778 A1 | 12/2003 | Park et al. |
| 2003/0232467 A1 | 12/2003 | Anderson et al. |
| 2004/0005740 A1 | 1/2004 | Lochtefeld et al. |
| 2004/0007715 A1 | 1/2004 | Webb et al. |
| 2004/0007724 A1 | 1/2004 | Murthy et al. |
| 2004/0009649 A1 | 1/2004 | Kub et al. |
| 2004/0012037 A1 | 1/2004 | Venkatesan et al. |
| 2004/0012075 A1 | 1/2004 | Bedell et al. |
| 2004/0014276 A1 | 1/2004 | Murthy et al. |
| 2004/0014304 A1 | 1/2004 | Bhattacharyya |
| 2004/0018699 A1 | 1/2004 | Boyd et al. |
| 2004/0031979 A1 | 2/2004 | Lochtefeld |
| 2004/0031990 A1 | 2/2004 | Jin et al. |
| 2004/0041174 A1 | 3/2004 | Okihara |
| 2004/0041210 A1 | 3/2004 | Mouli |
| 2004/0048091 A1 | 3/2004 | Sato et al. |
| 2004/0048454 A1 | 3/2004 | Sakaguchi |
| 2004/0051140 A1 | 3/2004 | Bhattacharyya |
| 2004/0053477 A1 | 3/2004 | Ghyselen et al. |
| 2004/0070035 A1 | 4/2004 | Murthy et al. |
| 2004/0075149 A1 | 4/2004 | Fitzgerald et al. |
| 2004/0084735 A1 | 5/2004 | Murthy et al. |
| 2004/0110378 A1 | 6/2004 | Ghyselen et al. |
| 2004/0119101 A1 | 6/2004 | Schrom et al. |
| 2004/0142545 A1 | 7/2004 | Ngo et al. |
| 2004/0173790 A1 | 9/2004 | Yeo et al. |
| 2004/0173815 A1 | 9/2004 | Yeo et al. |
| 2004/0219726 A1 | 11/2004 | Fitzgerald |
| 2004/0262631 A1 | 12/2004 | Fitzgerald |

| | | |
|---|---|---|
| 2005/0009288 A1 | 1/2005 | Fitzgerald |
| 2006/0003510 A1 | 1/2006 | Kammler et al. |

FOREIGN PATENT DOCUMENTS

| | | |
|---|---|---|
| EP | 0 514 018 | 11/1992 |
| EP | 0 587 520 | 3/1994 |
| EP | 0 683 522 | 11/1995 |
| EP | 0 828 296 | 3/1998 |
| EP | 0 829 908 | 3/1998 |
| EP | 0 838 858 | 4/1998 |
| EP | 1 020 900 | 7/2000 |
| EP | 1 174 928 | 1/2002 |
| FR | 2701599 | 8/1994 |
| GB | 2 342 777 | 4/2000 |
| JP | 61-141116 | 6/1986 |
| JP | 2-210816 | 8/1990 |
| JP | 3-036717 | 2/1991 |
| JP | 4-307974 | 10/1992 |
| JP | 5-166724 | 7/1993 |
| JP | 6-177046 | 6/1994 |
| JP | 6-244112 | 9/1994 |
| JP | 06-252046 | 9/1994 |
| JP | 7-094420 | 4/1995 |
| JP | 7-106446 | 4/1995 |
| JP | 7-240372 | 9/1995 |
| JP | 9-219524 | 8/1997 |
| JP | 10-270685 | 10/1998 |
| JP | 11-233744 | 8/1999 |
| JP | 2000-021783 | 1/2000 |
| JP | 2000-31491 | 1/2000 |
| JP | 2001319935 | 5/2000 |
| JP | 2002-076334 | 3/2002 |
| JP | 2002-164520 | 6/2002 |
| JP | 2002-289533 | 10/2002 |
| WO | WO 98/59365 | 12/1998 |
| WO | WO 99/53539 | 10/1999 |
| WO | WO 00/48239 | 8/2000 |
| WO | WO 00/54338 | 9/2000 |
| WO | WO 01/22482 | 3/2001 |
| WO | WO 01/54202 | 7/2001 |
| WO | WO 01/93338 | 12/2001 |
| WO | WO 01/99169 A2 | 12/2001 |
| WO | WO 02/13262 | 2/2002 |
| WO | WO 02/15244 A2 | 2/2002 |
| WO | WO 02/27783 A1 | 4/2002 |
| WO | WO 02/47168 | 6/2002 |
| WO | WO 02/071488 | 9/2002 |
| WO | WO 02/071491 | 9/2002 |
| WO | WO 02/071495 A1 | 9/2002 |
| WO | WO 02/082514 A1 | 10/2002 |
| WO | WO 2004/006311 A2 | 1/2004 |
| WO | WO 2004/006326 A1 | 1/2004 |
| WO | WO 2004/006327 A2 | 1/2004 |
| WO | WO 2004/019403 A2 | 3/2004 |
| WO | WO 2004/019404 A2 | 3/2004 |

OTHER PUBLICATIONS

Armstrong et al., "Design of Si/SiGe Heterojunction Complementary Metal-Oxide-Semiconductor Transistors," *IEDM Technical Digest* (1995) pp. 761-764.

Armstrong, "Technology for SiGe Heterostructure-Based CMOS Devices", Ph.D Thesis, Massachusetts Institute of Technology (1999) pp. 1-154.

Augusto et al., "Proposal for a New Process Flow for the Fabrication of Silicon-Based Complementary MOD-MOSFETs without Ion Implantation," *Thin Solid Films*, vol. 294, No. 1-2 (1997) pp. 254-258.

Barradas et al., "RBS analysis of MBE-grown SiGe/(001) Si heterostructures with thin, high Ge content SiGe channels for HMOS transistors," *Modern Physics Letters B* (2001) (abstract).

Batterman, "Hillocks, Pits, and Etch Rate in Germanium Crystals," *Journal of Applied Physics*, vol. 28, No. 11 (Nov. 1957), pp. 1236-1241.

Bohg, "Ethylene Diamine-Pyrocatechol-Water Mixture Shows Etching Anomaly in Boron-Doped Silicon," *Journal of the Electrochemical Society*, vol. 118, No. 2 (Feb. 1971), pp. 401-402.

Borenstein et al., "A New Ultra-Hard Etch-Stop Layer for High Precision Micromachining," *Proceedings of the 1999 12th IEEE International Conference on Micro Electro Mechanical Systems (MEMs)* (Jan. 17-21, 1999) pp. 205-210.

Bouillon et al., "Search for the optimal channel architecture for 0.18/0.12 μm bulk CMOS Experimental study," *IEEE* (1996) pp. 21.2.1-21.2.4.

Brunner et al., "Molecular beam epitaxy growth and thermal stability of $Si_{1-x}Ge_x$ layers on extremely thin silicon-on-insulator substrates," *Thin Solid Films*, vol. 321 (1998), pp. 245-250.

Bufler et al., "Hole transport in strained $Si_{1-x}Ge_x$ alloys on Si1-yGey substrates," *Journal of Applied Physics*, vol. 84, No. 10 (Nov. 15, 1998) pp. 5597-5602.

Burghartz et al., "Microwave Inductors and Capacitors in Standard Multilevel Interconnect Silicon Technology", *IEEE Transactions on Microwave Theory and Techniques*, vol. 44, No. 1 (Jan. 1996) pp. 100-104.

Canaperi et al., "Preparation of a relaxed Si-Ge layer on an insulator in fabricating high-speed semiconductor devices with strained epitaxial films," International Business Machines Corporation, USA (2002) (abstract).

Carlin et al., "High Efficiency GaAs-on-Si Solar Cells with High Voc Using Graded GeSi Buffers," *IEEE* (2000) pp. 1006-1011.

Chang et al., "Selective Etching of SiGe/Si Heterostructures," *Journal of the Electrochemical Society*, No. 1 (Jan. 1991) pp. 202-204.

Chen et al., "The Band Model and the Etching Mechanism of Silicon in Aqueous KOH," *Journal of the Electrochemical Society*, vol. 142, No. 1 (Jan. 1995), pp. 170-176.

Cheng et al., "Electron Mobility Enhancement in Strained-Si n-MOSFETs Fabricated on SiGe-on-Insulator (SGO1) Substrates," *IEEE Electron Device Letters*, vol. 22, No. 7 (Jul. 2001) pp. 321-323.

Cheng et al., "Relaxed Silicon-Germanium on Insulator Substrate by Layer Transfer," *Journal of Electronic Materials*, vol. 30, No. 12 (2001) pp. L37-L39.

Cullis et al, "Growth ripples upon strained SiGe epitaxial layers on Si and misfit dislocation interactions," *Journal of Vacuum Science and Technology A*, vol. 12, No. 4 (Jul./Aug. 1994) pp. 1924-1931.

Currie et al., "Controlling Threading Dislocation in Ge on Si Using Graded SiGe Layers and Chemical-Mechanical Polishing," vol. 72 No. 14 (Apr. 6, 1998) pp. 1718-1720.

Currie et al., "Carrier mobilities and process stability of strained Si n- and p-MOSFETs on SiGe virtual substrates," *J. Vac. Sci. Technol. B.*, vol. 19, No. 6 (Nov./Dec. 2001) pp. 2268-2279.

Desmond et al., "The Effects of Process-Induced Defects on the Chemical Selectivity of Highly Doped Boron Etch Stops in Silicon," *Journal of the Electrochemical Society*, vol. 141, No. 1 (Jan. 1994), pp. 178-184.

Eaglesham et al., "Dislocation-Free Stranski-Krastanow Growth of Ge on Si(100)," *Physical Review Letters*, vol. 64, No. 16 (Apr. 16, 1990) pp. 1943-1946.

Ehman et al., "Morphology of Etch Pits on Germanium Studied by Optical and Scanning Electron Microscopy," *Journal of Applied Physics*, vol. 41, No. 7 (Jun. 1970), pp. 2824-2827.

Examination Report for European Patent Application No. 98 931 529.6-2203, dated Jan. 10, 2002, 4 pages.

Examination Report for European Patent Application No. 98 931 529.6-2203, dated May 9, 2003, 5 pages.

Examination Report for European Patent Application No. 01 973 651.1-1528, dated Mar. 22, 2004, 3 pages.

Examination Report for European Patent Application No. 01 989 893.1-1235, dated Aug. 16, 2004, 5 pages.

Examination Report for European Patent Application No. 01 973 651.1-1528, dated Nov. 13, 2004, 9 pages.

Examination Report for European Patent Application No. 02 709 406.9-2203, dated May 11, 2004, 3 pages.

Examination Report for European Patent Application No. 02 709 406.9-2203, dated Mar. 24, 2005, 5 pages.

Feijóo et al., "Etch Stop Barriers in Silicon Produced by Ion Implantation of Electrically Non-Active Species," *Journal of the Electrochemical Society*, vol. 139, No. 8 (Aug. 1992), pp. 2309-2313.

Feijóo et al., "Epitaxial Si-Ge Etch Stop Layers with Ethylene Diamine Pyrocatechol for Bonded and Etchback Silicon-on-Insulator," *Journal of Electronic Materials*, vol. 23, No. 6 (Jun. 1994) pp. 493-496.

Finne et al., "A Water-Amine-Complexing Agent System for Etching Silicon," *Journal of the Electrochemical Society*, vol. 114, No. 9 (Sep. 1967), pp. 965-970.

Fischetti et al., "Band structure, deformation potentials, and carrier mobility in strained Si, Ge, and SiGe alloys," *J. Appl. Phys.*, vol. 80, No. 4 (Aug. 15, 1996) pp. 2234-2252.

Fischetti, "Long-range Coulomb interactions in small Si devices. Part II. Effective electron mobility in thin-oxide structures," *Journal of Applied Physics*, vol. 89, No. 2 (Jan. 15, 2001) pp. 1232-1250.

Fitzgerald et al., "Dislocation dynamics in relaxed graded composition semiconductors," *Materials Science and Engineering B67* (1999) pp. 53-61.

Fitzgerald et al., "Dislocations in Relaxed SiGe/Si Heterostructures," Physica Status Solidi A, Applied Research, Berlin, DE, vol. 171, Nr. 1, p. 227-238, Jan. 16, 1999.

Fitzgerald, "GeSi/Si Nanostructures," *Annual Review of Materials Science*, vol. 25 (1995), pp. 417-454.

Fitzgerald et al., "Relaxed $Ge_xSi_{1-x}$ structures for III-V integration with Si and high mobility two-dimensional electron gases in Si," AT&T Bell Laboratories, Murray Hill, NJ 07974 (1992) *American Vacuum Society*, pp. 1807-1819.

Fitzgerald et al., "Totally Relaxed $Ge_xSi_{1-x}$ Layers with Low Threading Dislocation Densities Grown on Si Substrates," *Applied Physics Letters*, vol. 59, No. 7 (Aug. 12, 1991) pp. 811-813.

Frank, "Orientation-Dependent Dissolution of Germanium," *Journal of Applied Physics*, vol. 31, No. 11 (Nov. 1960), pp. 1996-1999.

Fukatsu, "SiGe-based semiconductor-on-insulator substrate created by low-energy separation-by-implanted-oxygen," *Applied Physics Letters*, vol. 72, No. 26 (Jun. 29, 1998), pp. 3485-3487.

Gannavaram, et al., "Low Temperature ($\leq 800°$ C.) Recessed Junction Selective Silicon-Germanium Source/Drain Technology for sub-70 nm CMOS," *IEEE International Electron Device Meeting Technical Digest*, (2000), pp. 437-440.

Garone et al., "Silicon vapor phase epitaxial growth catalysis by the presence of germane," *Applied Physics Letters*, vol. 56, No. 13 (Mar. 26, 1990) pp. 1275-1277.

Ge et al., "Process-Strained Si (PSS) CMOS Technology Featuring 3D Strain Engineering," *IEEE International Electron Devices Meeting Technical Digest*, (2003) pp. 73-76.

Ghandi et al., "Chemical Etching of Germanium," *Journal of the Electrochemical Society*, vol. 135, No. 8 (Aug. 1988), pp. 2053-2054.

Ghani et al., "A 90nm High Volume Manufacturing Logic Technology Featuring Novel 45nm Gate Length Strained Silicon CMOS Transistors," *IEEE International Electron Devices Meeting Technical Digest*, (2003), 978-980.

Godbey et al., (1990) "Fabrication of Bond and Etch-Back Silicon Insulator Using a Strained $SI_{0.7}GE_{0.3}$ Layer as an Etch Stop," *Journal of the Electrical Society*, vol. 137, No. 10 (Oct. 1990) pp. 3219-3223.

Godbey et al., "A $Si_{0.7}Ge_{0.3}$ strained-layer etch stop for the generation of thin layer undoped silicon," *Applied Physics Letters*, vol. 56, No. 4 (Jan. 22, 1990), pp. 373-375.

Gray and Meyer, "Phase-Locked Loops", *Analysis and Design of Analog Integrated Circuits* (1984) pp. 605-632.

Grillot et al., "Acceptor diffusion and segregation in $(Al_xGa_{1-x})_{0.5}In_{0.5}P$ heterostructures," *Journal of Applied Physics*, vol. 91, No. 8 (2002), pp. 4891-4899.

Grützmacher et al., "Ge segregation in SiGe/Si heterostructures and its dependence on deposition technique and growth atmosphere," *Applied Physics Letters*, vol. 63, No. 18 (Nov. 1, 1993) pp. 2531-2533.

Hackbarth et al., "Alternatives to thick MBE-grown relaxed SiGe buffers," *Thin Solid Films*, vol. 369, No. 1-2 (Jul. 2000) pp. 148-151.

Hackbarth et al., "Strain relieved SiGe buffers for Si-based heterostructure field-effect transistors," *Journal of Crystal Growth*, vol. 201/202 (1999) pp. 734-738.

Halsall et al., "Electron diffraction and Raman studies of the effect of substrate misorientation on ordering in the AlGaInP system," *Journal of Applied Physics*, vol. 85, No. 1 (1999), pp. 199-202.

Hamada et al., "A New Aspect of Mechanical Stress Effects in Scaled MOS Devices," *IEEE Transactions on Electron Devices*, vol. 38, No. 4 (Apr. 1991), pp. 895-900.

Herzog et al., "SiGe-based FETs: buffer issues and device results," *Thin Solid Films*, vol. 380 (2000) pp. 36-41.

Herzog et al., "X-Ray Investigation of Boron- and Germanium-Doped Silicon Epitaxial Layers," *Journal of the Electrochemical Society*, vol. 131, No. 12 (Dec. 1984), pp. 2969-2974.

Höck et al., "Carrier mobilities in modulation doped $Si_{1-x}Ge_x$ heterostructures with respect to FET applications," *Thin Solid Films*, vol. 336 (1998) pp. 141-144.

Höck et al., "High hole mobility in $Si_{0.17}Ge_{0.83}$ channel metal-oxide-semiconductor field-effect transistors grown by plasma-enhanced chemical vapor deposition," *Applied Physics Letters*, vol. 76, No. 26 (Jun. 26, 2000) pp. 3920-3922.

Höck et al., "High performance 0.25 µm p-type Ge/SiGe MODFETs," *Electronics Letters*, vol. 34, No. 19 (Sep. 17, 1998) pp. 1888-1889.

Holmes, "The Orientation Dependence of Etching Effects on Germanium Crystals," *Acta Metallurgica*, vol. 7, No. 4 (Apr. 1959), pp. 283-290.

Hsu et al., "Surface morphology of related $Ge_xSi_{1-x}$ films," *Appl. Phys. Lett.*, vol. 61, No. 11 (1992), pp. 1293-1295.

Huang et al., (2001) "Carrier Mobility enhancement in strained Si-on-insulatoir fabricated by wafer bonding", *2001 Symposium on VLSI Technology, Digest of Technical Papers*, pp. 57-58.

Huang et al., "Isolation Process Dependence of Channel Mobility in Thin-Film SOI Devices," *IEEE Electron Device Letters*, vol. 17, No. 6 (Jun. 1996), pp. 291-293.

Huang et al., "LOCOS-Induced Stress Effects on Thin-Film SOI Devices," *IEEE Transactions on Electron Devices*, vol. 44, No. 4 (Apr. 1997), pp. 646-650.

Huang, et al., "Reduction of Source/Drain Series Resistance and Its Impact on Device Performance for PMOS Transistors with Raised $Si_{1-x}Ge_x$ Source/Drain", *IEEE Electron Device Letters*, vol. 21, No. 9, (Sep. 2000) pp. 448-450.

Huang et al., "The Impact of Scaling Down to Deep Submicron on CMOS RF Circuits", IEEE Journal of Solid-State Circuits, vol. 33, No. 7, Jul. 1998, pp. 1023-1036.

Hunt et al., "Highly Selective Etch Stop by Stress Compensation for Thin-Film BESOI," *1990 IEEE/SOI Technology Conference*, (Oct. 2-4, 1990), pp. 145-146.

IBM Technical Disclosure Bulletin, vol. 32, No. 8A, Jan. 1990, "Optimal Growth Technique and Structure for Strain Relaxation of Si-Ge Layers on Si Substrates", pp. 330-331.

Iida et al., "Thermal behavior of residual strain in silicon-on-insulator bonded wafer and effects on electron mobility," *Solid-State Electronics*, vol. 43 (1999), pp. 1117-1120.

International Search Report for Patent Application No. PCT/US 98/13076, dated Oct. 27, 1998, 2 pages.

International Search Report for Related International Application No. PCT/US/18007, Jan. 5, 2004.

Ishikawa et al., "SiGe-on-insulator substrate using SiGe alloy grown Si(001)," *Applied Physics Letters*, vol. 75, No. 7 (Aug. 16, 1999) pp. 983-985.

Ismail et al., "Modulation-doped n-type Si/SiGe with inverted interface," *Appl. Phys. Lett.*, vol. 65, No. 10 (Sep. 5, 1994) pp. 1248-1250.

Ismail, "Si/SiGe High-Speed Field-Effect Transistors," *Electronic Devices Meeting*, Washington, D.C. (Dec. 10, 1995) pp. 20.1.1-20.1.4.

Ito et al., "Mechanical Stress Effect on Etch-Stop Nitride and its Impact on Deep Submicron Transistor Design," *IEEE International Electron Devices Meeting Technical Digest*, (2000), pp. 247-250.

Jaccodine, "Use of Modified Free Energy Theorems to Predict Equilibrium Growing and Etching Shapes," *Journal of Applied Physics*, vol. 33, No. 8 (Aug. 1962), pp. 2643-2647.

Kearney et al., "The effect of alloy scattering on the mobility of holes in a $Si_{1-x}Ge_x$ quantum well," *Semicond. Sci Technol.*, vol. 13 (1998) pp. 174-180.

Kern, "Chemical Etching of Silicon, Germanium, Gallium, Arsenide, and Gallium Phosphide," *RCA Review*, vol. 39 (Jun. 1978), pp. 278-308.

Kim et al., "A Fully Integrated 1.9-GHz CMOS Low-Noise Amplifier," *IEEE Microwave and Guided Wave Letters*, vol. 8, No. 8 (Aug. 1998) pp. 293-295.

Klauk et al., "Thermal stability of undoped strained Si channel SiGe heterostructures," Applied Physics Letter, No. 68, Apr. 1, 1996, pp. 1975-1977.

Koester et al., "Extremely High Transconductance $Ge/Si_{0.4}Ge_{0.6}$ p-MODFET's Grown by UHV-CVD," *IEEE Electron Device Letters*, vol. 21, No. 3 (Mar. 2000) pp. 110-112.

König et al., "p-Type Ge-Channel MODGET's with High Transconductance Grown on Si Substrates," *IEEE Electron Device Letters*, vol. 14, No. 4 (Apr. 1993) pp. 205-207.

König et al., "SiGe HBTs and HFETs," *Solid-State Electronics*, vol. 38, No. 9 (1995) pp. 1595-1602.

Kuznetsov et al., "Technology for high-performance n-channel SiGe modulation-doped field-effect transistors," *J. Vac. Sci. Technol., B 13*(6) (Nov./Dec. 1995) pp. 2892-2896.

Lang et al., "Bulk Micromachining of Ge for IR Gratings," *Journal of Micromechanics and Microengineering*, vol. 6, No. 1 (Mar. 1996), pp. 46-48.

Langdo et al., (2002) "Preparation of Novel SiGe-free Strained Si on Insulator Substrates" *IEEE International SOI Conference*, pp. 211-212 (XP002263057).

Larson, "Integrated Circuit Technology Options for RFIC's—Present Status and Future Directions", *IEEE Journal of Solid-State Circuits*, vol. 33, No. 3, Mar. 1998, pp. 387-399.

Leancu et al., "Anisotropic Etching of Germanium," *Sensors and Actuators*, A46-47 (1995), pp. 35-37.

Lee et al., "CMOS RF Integrated Circuits at 5 GHz and Beyond", *Proceedings of the IEEE*, vol. 88, No. 10 (Oct. 2000) pp. 1560-1571.

Lee et al., "Strained Ge channel p-type metal-oxide-semiconductor field-effect transistors grown on $Si_{1-x}Ge_x/Si$ virtual substrates," *Applied Physics Letters*, vol. 79, No. 20 (Nov. 12, 2001) pp. 3344-3346.

Lee et al., "Strained Ge channel p-type MOSFET's fabricated on $Si_{1-x}Ge_x/Si$ virtual substrates," *Mat. Res. Soc. Symp. Proc.*, vol. 686 (2002) pp. A1.9.1-A1.9.5.

LeGoues et al., "Relaxation of SiGe thin films grown on $Si/SiO_2$ substrates," *Applied Physics Letters*, vol. 75, No. 11 (Jun. 1, 1994), pp. 7240-7246.

Lehmann et al., "Implanted Carbon: An Effective Etch-Stop in Silicon," *Journal of the Electrochemical Society*, vol. 138, No. 5 (May 1991), pp. 3-4.

Leitz et al., "Channel Engineering of SiGe-Based Heterostructures for High MOSFETs," *Mat. Res. Soc. Symp. Proc.*, vol. 686 (2002) pp. A3.10.1-A3.10.6.

Leitz et al., "Dislocation glide and blocking kinetics in compositionally graded SiGe/Si," *Journal of Applied Physics*, vol. 90, No. 6 (Sep. 15, 2001) pp. 2730-2736.

Leitz et al., "Hole mobility enhancements in strained Si/Si1-yGey p-type metal-oxide-semiconductor field-effect transistors grown on relaxed $Si_{1-x}Ge_x$ (x<y) virtual substrates," *Applied Physics Letters*, vol. 79, No. 25 (Dec. 17, 2001) pp. 4246-4248.

Li et al., "Design of high speed Si/SiGe heterojunction complementary metal-oxide-semiconductor field effect transistors with reduced short-channel effects," *J. Vac. Sci. Technol.*, vol. 20 No. 3 (May/Jun. 2002) pp. 1030-1033.

Lochtefeld et al., "Investigating the Relationship Between Electron Mobility and Velocity in Deeply Scaled NMOS via Mechanical Stress," *IEEE Electronic Device Letters*, vol. 22, No. 12 (2001), pp. 591-593.

Lu et al., "High Performance 0.1 μm Gate-Length P-Type SiGe MODFET's and MOS-MODFET's", *IEEE Transactions on Electron Devices*, vol. 47, No. 8 (Aug. 2000) pp. 1645-1652.

König et al., "Design Rules for n-Type SiGe Hetero FETs," *Solid State Electronics*, vol. 41, No. 10 (1997), pp. 1541-1547.

Kummer et al., "Low energy plasma enhanced chemical vapor deposition," *Materials Science and Engineering B89* (2002) pp. 288-295.

Maiti et al., "Strained-Si heterostructure field effect transistors," *Semicond. Sci. Technol.*, vol. 13 (1998) pp. 1225-1246.

Maszara, "Silicon-On-Insulator by Wafer Bonding: A Review," *Journal of the Electrochemical Society*, No. 1 (Jan. 1991) pp. 341-347.

Meyerson et al., "Cooperative Growth Phenomena in Silicon/Germanium Low-Temperature Epitaxy," *Applied Physics Letters*, vol. 53, No. 25 (Dec. 19, 1988) pp. 2555-2557.

Mizuno et al., "Advanced SOI-MOSFETs with Strained-Si Channel for High Speed CMOS-Electron/Hole Mobility Enhancement," 2000 Symposium on VLSI Technology, Digest of Technical Papers, Honolulu, (Jun. 13-15), IEEE New York, NY, pp. 210-211.

Mizuno et al., "Electron and Hold Mobility Enhancement in Strained-Si MOSFET's on SiGe-on-Insulator Substrates Fabricated by SIMOX Technology," *IEEE Electron Device Letters*, vol. 21, No. 5 (May 2000) pp. 230-232.

Mizuno et al., "High Performance Strained-Si p-MOSFETs on SiGe-on-Insulator Substrates Fabricated by SIMOX Technology," *IEEE IDEM Technical Digest* (1999) pp. 934-936.

Narozny et al., "Si/SiGe Heterojunction Bipolar Transistor with Graded GAP SiGe Base Made by Molecular Beam Epitaxy," *IEEE IEDM* (1988), pp. 562-565.

Nayak et al., "High-Mobility Strained-Si PMOSFET's"; *IEEE Transactions on Electron Devices*, vol. 43, No. 10 (Oct. 1996) pp. 1709-1716.

Notice of Preliminary Rejection for Korean Patent Application No. 10-1999-7012279, dated Feb. 21, 2002, 2 pages (English translation attached).

Notice of Final Rejection for Korean Patent Application No. 10-1999-7012279, dated Feb. 25, 2003 2 pages (English translation attached).

O'Neill et al., "SiGe Virtual substrate N-channel heterojunction MOSFETS," *Semicond. Sci. Technol.*, vol. 14 (1999) pp. 784-789.

Ootsuka et al., "A Highly Dense, High-Performance 130nm node CMOS Technology for Large Scale System-on-a-Chip Applications," *IEEE International Electron Devices Meeting Technical Digest*, (2000), pp. 575-578.

Ota, Y. et al., "Application of heterojunction FET to power amplifier for cellular telephone," *Electronics Letters*, vol. 30, No. 11 (May 26, 1994) pp. 906-907.

Ota et al., "Novel Locally Strained Channel Technique for High Performance 55nm CMOS," *IEEE International Electron Devices Meeting Technical Digest*, (2002), pp. 27-30.

Öztürk, et al., "Advanced $Si_{1-x}Ge_x$ Source/Drain and Contact Technologies for Sub-70 nm CMOS," *IEEE International Electron Device Meeting Technical Digest*, (2002), pp. 375-378.

Öztürk, et al., "Low Resistivity Nickel Germanosilicide Contacts to Ultra-shallow $Si_{1-x}Ge_x$ Source/Drain Junctions for Nanoscale CMOS," *IEEE International Electron Device Meeting Technical Digest* (2003), pp. 497-500.

Öztürk, et al., "Selective Silicon-Gremanium Source/Drain Technology for Nanoscale CMOS," *Mat. Res. Soc. Symp. Proc.*, vol. 717, (2002), pp. C4.1.1-C4.1.12.

Öztürk, et al., "Ultra-Shallow Source/Drain Junctions for Nanoscale CMOS Using Selective Silicon-Germanium Technology," *Extended Abstracts of International Workshop on Junction Technology*, (2001), pp. 77-82.

Palik et al., "Ellipsometric Study of the Etch-Stop Mechanism in Heavily Doped Silicon," *Journal of the Electrochemical Society*, vol. 132, No. 1 (Jan. 1985), pp. 135-141.

Palik et al., "Study of Bias-Dependent Etching of Si in Aqueous KOH," *Journal of the Electrochemical Society*, vol. 134, No. 2 (Feb. 1987), pp. 404-409.

Palik et al., "Study of the Etch-Stop Mechanism in Silicon," *Journal of the Electrochemical Society*, vol. 129, No. 9 (Sep. 1982), pp. 2051-2059.

Papananos, "Low Noise Amplifiers in MOS Technologies," and "Low Noise Tuned-LC Oscillator," *Radio-Frequency Microelectronic Circuits for Telecommunication Applications* (1999) pp. 115-117, 188-193.

Parker et al., "SiGe heterostructure CMOS circuits and applications," *Solid State Electronics*, vol. 43 (1999) pp. 1497-1506.

Petersen, "Silicon as a Mechanical Material," *Proceedings of the IEEE*, vol. 70, No. 5 (May 1982), pp. 420-457.

Powell et al., "New approach to the growth of low dislocation relaxed SiGe material," *Applied Physics Letters*, vol. 64, No. 14 (Apr. 4, 1994), pp. 1865-1858.

Rai-Choudhury et al., "Doping of Epitaxial Silicon," *Journal of Crystal Growth*, vol. 7 (1970), pp. 361-367.

Raley et al., "(100) Silicon Etch-Rate Dependence on Boron Concentration in Ethylenediamine-Pyrocatechol-Water Solutions," *Journal of the Electrochemical Society*, vol. 131, No. 1 (Jan. 1984), pp. 161-170.

Ransom et al., "Gate-Self-Aligned n-channel and p-channel Germanium MOSFET's," *IEEE Transactions on Electron Devices*, vol. 38, No. 12 (Dec. 1991) pp. 2695.

Reinking et al., "Fabrication of high-mobility Ge p-channel MOSFETs on Si substrates," *Electronics Letters*, vol. 35, No. 6 (Mar. 18, 1999) pp. 503-504.

Rim et al., "Enhanced Hole Mobilities in Surface-channel Strained-Si p-MOSFETs"; *IEDM*, 1995, pp. 517-520.

Rim, "Application of Silicon-Based Heterostructures to Enhanced Mobility Metal-Oxide-Semiconductor Field-Effect Transistors", Ph.D. Thesis, Stanford University (1999) pp. 1-184.

Robbins et al., "A model for heterogeneous growth of $Si_{1-x}Ge_x$ films for hydrides," *Journal of Applied Physics*, vol. 69, No. 6 (Mar. 15, 1991) pp. 3729-3732.

Rosenblad et al., "Strain relaxation of graded SiGe buffers brown at very high rates," Materials Science and Engineering B, Elsevier Sequoia, Lausanne, CH, vol. 71, Nr. 1-3, p. 20-23, Feb. 2000.

Sadek et al., "Design of Si/SiGe Heterojunction Complementary Metal-Oxide-Semiconductor Transistors," *IEEE Trans. Electronc Devices* (Aug. 1996) pp. 1224-1232.

Sakaguchi et al., "ELTRAN® by Splitting Porous Si Layers," Proc. 195th Int. SOI Symposium, vol. 99-3, *Electrochemical Society* (1999) pp. 117-121.

Schäffler, "Highly-Mobility Si and Ge Structures," *Semiconductor Science and Technology*, vol. 12 (1997) pp. 1515-1549.

Seidel et al., "Anisotropic Etching of Crystalline Silicon in Alkaline Solutions," *Journal of the Electrochemical Society.*, vol. 137, No. 11 (Nov. 1990), pp. 3626-3632.

Senna et al., "Gallium Doping for Silicon Etch Stop in KOH," *Transducers '95/Eurosensors IX*, the 8th International Conference on Solid-State Sensors and Actuators and Eurosensors IX, Stockholm, Sweden, Jun. 25-29, 1995, pp. 194-195.

Shang et al., "The Development of an Anisotropic Si Etch Process Selective to $Ge_xSi_{1-x}$ Underlayers," *Journal of the Electrochemical Society.*, vol. 141, No. 2 (Feb. 1994), pp. 507-510.

Shimizu et al., "Local Mechanical-Stress Control (LMC): A New Technique for CMOS-Performance Enhancement," *IEEE International Electron Devices Meeting Technical Digest*, (2001), pp. 433-436.

Soderbarg, "Fabrication of BESOI-Materials Using Implanted Nitrogen as an Effective Etch Stop Barrier," *1989 IEEE SOS/SOI Technology Conference*, (Oct. 3-5, 1989), pp. 64.

Sugimoto et al., "A 2V, 500 MHz and 3V, 920 MHz Low-Power Current-Mode 0.6 µm CMOS VCO Circuit", *IEICE Trans. Electron.*, vol. E82-C, No. 7 (Jul. 1999) pp. 1327-1329.

Sundaram et al., "Electrochemical etching of Silicon by Hydrazine," *Journal of the Electrochemical Society*, vol. 140, No. 6 (Jun. 1993), pp. 1592-1597.

Sze, "Physics of Semiconductor Devices," (1991).

Takagi et al., "On the University of Inversion Layer Mobility in Si MOSFET's: Part I-Effects of Substrate Impurity Concentration," *IEEE Transactions on Electron Devices*, vol. 41, No. 12 (Dec. 1994), pp. 2357-2362.

Ternent et al., "Metal Gate Strained Silicon MOSFETs for Microwave Integrated Circuits", *IEEE* (Oct. 2000) pp. 38-43.

Thompson et al., "A Logic Nanotechnology Featuring Strained-Silicon," *IEEE Electron Device Letters*, vol. 25, No. 4 (Apr. 2004), pp. 191-193.

Thompson et al., "A 90 nm Logic Technology Featuring 50nm Strained-Silicon Channel Transistors, 7 layers of Cu Interconnects, Low k ILD, and 1 um² SRAM Cell," *IEEE International Electron Devices Meeting Technical Digest*, (2002), pp. 61-64.

Ting et al., "Monolithic Integration of III-V Materials and Devices on Silicon," Part of the0 SPIE Conference on Silicon-Based Optoelectronics, San Jose, CA, (Jan. 1999), pp. 19-28.

Tiwari et al., "Hole Mobility Improvement in Silicon-on-Insulator and Bulk Silicon Transistors Using Local Strain," *IEEE International Electron Devices Meeting Technical Digest*, (1997), pp. 939-941.

Tsang et al., "Measurements of alloy composition and strain in thin $Ge_xSi_{1-x}$ layers," *J. Appl. Phys.*, vol. 75 No. 12 (Jun. 15, 1994) pp. 8098-8108.

Tweet et al., "Factors determining the composition of strained GeSi layers grown with disilane and germane," *Applied Physics Letters*, vol. 65, No. 20 (Nov. 14, 1994) pp. 2579-2581.

Uchino, et al., "A Raised Source/Drain Technology Using In-situ P-doped SiGe and B-doped Si for 0.1-µm CMOS ULSIs," *IEEE International Electron Device Meeting Technical Digest*, (1997), pp. 479-482.

Usami et al., "Spectroscopic study of Si-based quantum wells with neighboring confinement structure," *Semicon. Sci. Technol.* (1997) (abstract).

Vol'fson et al., "Fundamental Absorption Edge of Silicon Heavily Doped with Donor or Acceptor Impurities," *Soviet Physics Semiconductors*, vol. 1, No. 3 (Sep. 1967), pp. 327-332.

Welser et al., "Electron Mobility Enhancement in Strained-Si N-Type Metal-Oxide-Semiconductor Field-Effect Transistors," *IEEE Electron Device Letters*, vol. 15, No. 3 (Mar. 1994) pp. 100-102.

Welser et al., "Evidence of Real-Space Hot-Electron Transfer in High Mobility, Strained-Si Multilayer MOSFETs," *IEEE IDEM Technical Digest* (1993) pp. 545-548.

Welser et al., "NMOS and PMOS Transistors Fabricated in Strained Silicon/Relaxed Silicon-Germanium Structures," *IEEE IDEM Technical Digest* (1992) pp. 1000-1002.

Welser, "The Application of Strained Silicon/Relaxed Silicon Germanium Heterostructures to Metal-Oxide-Semiconductor Field-Effect Transistors," Ph.D. Thesis, Stanford University (1994) pp. 1-205.

Wolf et al., "Silicon Processing for the VLSI Era," vol. 1 *Process Technology* (1986) pp. 384-386.

Wu, "Novel Etch-Stop Materials for Silicon Micromachining," Thesis Submitted to the Massachusetts Institute of Technology Department of Materials Science and Engineering on May 9, 1997, pp. 1-62.

Xie et al., "Semiconductor Surface Roughness: Dependence on Sign and Magnitude of Bulk Strain," *The Physical Review Letters*, vol. 73, No. 22 (Nov. 28, 1994) pp. 3006-3009.

Xie et al., "Very high mobility two-dimensional hole gas in Si/$Ge_xSi_{1-x}$/Ge structures grown by molecular beam epitaxy," *Appl. Phys. Lett.*, vol. 63, No. 16 (Oct. 18, 1993) pp. 2263-2264.

Xie, "SiGe Field effect transistors," *Materials Science and Engineering*, vol. 25 (1999) pp. 89-121.

Yamagata et al., "Bonding, Splitting and Thinning by Porous Si in ELTRAN®; SOI-Epi Wafer™;" *Mat. Res. Soc. Symp. Proc.*, vol. 681E (2001) pp. 18.2.1-18.2-10.

Yeo et al., "Nanoscale Ultra-Thin-Body Silicon-on-Insulator P-MOSFET with a SiGe/Si Heterostructure Channel," *IEEE Electron Device Letters*, vol. 21, No. 4 (Apr. 2000) pp. 161-163.

Yi et al., "$Si_{1-x}Ge_x$/Si Multiple Quantum Well Wires Fabricated Using Selective Etching," *Materials Research Society Symposium Proceedings*, vol. 379 (1995), pp. 91-96.

Zhang et al., "Demonstration of a GaAs-Based Compliant Substrate Using Wafer Bonding and Substrate Removal Techniques," Electronic Materials and Processing Research Laboratory, Department of Electrical Engineering, University Park, PA 16802 (1998) pp. 25-28.

Al-Bayati et al., "Exploring the limits of pre-amorphization implants on controlling channeling and diffusion of low energy B implants and ultra shallow junction formation," 2000 Conf. on Ion Implantation Technology, pp. 54-57.

Andrieu et al., "Co-integrated Dual Strained Channels on Fully Depleted sSDOI CMOSFETs with Hf0$_2$/TiN Gate Stack down to 15 nm Gate Length," 2005 IEEE Int'l SOI Conf. Proc., pp. 223-224.

Bruel et al., "® Smart Cut: A Promising New SOI Material Technology," Proc. 1995 IEEE Int'l SOI Conf., pp. 178-179.

Bruel, "Silicon on Insulator Material Technology," Electronic Letters, vol. 13, No. 14, pp. 1201-1202 (1995).

Examination Report for European Patent Application No. 01 973 651.1, dated Sep. 7, 2005, 4 pages.

Huang et al., "High-quality strain-relaxed SiGe alloy grown on implanted silicon-on-insulator substrate," Applied Physics Letters, vol. 76, No. 19, pp. 2680-2682 (2000).

International Search Report for Int'l Application No. PCT/US01/46322, mailed Jan. 22, 2003.

Ishikawa et al., "Creation of Si-Ge-based SIMOX structures by low energy oxygen implantation," Proc. 1997 IEEE Int'l SOI Conf., pp. 16-17.

Kubota et al. "New SOI CMOS Proess with Selective Oxidation," 1986 IEEE IEDM Tech. Dig., pp. 814-816.

Ming et al., "Interfacial roughness scaling and strain in lattice mismatched Si$_{0.4}$Ge$_{0.6}$ thin films on S,i" Applied Physics Letters, vol. 67, No. 5, pp. 629-631 (1995).

Ming et al., "Microscopic structure of interface in Si$_{1-x}$/Si heterostructures and superlattices studied by x-ray scattering and fluorescence yield, " Physical Review B, vol. 47, No. 24, pp. 373-381 (1993).

Nishi et al., "Handbook of Semiconductor Manufacturing Technology," Marcel Dekker AG, New York, NY, 2000 pp. 1-22.

O'Neill et al., "Deep Submicron CMOS Based on Silicon Germanium Technology," IEEE Trans. on Electron Devices, vol. 43, No. 6, pp. 911-918 (1996).

Partial International Search Report for Internation Patent Application No. PCT/US2006/035814, Feb. 7, 2007 (7 pages).

Rim et al., "Fabrication and Analysis fo Deep Submicron Strained-Si N-MOSFET's," IEEE Trans. on Electron Devices, vol. 47, No. 7, pp. 1406-1415 (2000).

Thean et al., "Performance of super-critical strained-si directly on insulator (SC-SSOI) CMOS based on high-performance PD-SOI technology," 2005 Symp. on VLSI Tech., Dig. Tech. Papers, pp. 134-135.

Vossen et al., "Thin Film Processes II," Academic Press Inc., San Diego, CA 1991, pp. 370-442.

Wolfe et al. "Silicon Processing for the VLSI ERA, vol. 1; Process Technology," Marcel Dekker AG, New York, NY, 2000, pp. 1-35.

* cited by examiner

US 7,297,612 B2

METHODS FOR FORMING STRAINED-SEMICONDUCTOR-ON-INSULATOR DEVICE STRUCTURES BY USE OF CLEAVE PLANES

RELATED APPLICATIONS

This application is a divisional application of U.S. Ser. No. 10/456,103, filed Jun. 6, 2003 now U.S. Pat. No. 6,995,430, which claims the benefit of U.S. Provisional Application 60/386,968 filed Jun. 7, 2002, U.S. Provisional Application 60/404,058 filed Aug. 15, 2002, and U.S. Provisional Application 60/416,000 filed Oct. 4, 2002; the entire disclosures of this nonprovisional utility patent application and these three provisional applications are hereby incorporated by reference.

FIELD OF THE INVENTION

This invention relates to devices and structures comprising strained semiconductor layers and insulator layers.

BACKGROUND

Strained silicon-on-insulator structures for semiconductor devices combine the benefits of two advanced approaches to performance enhancement: silicon-on-insulator (SOI) technology and strained silicon (Si) technology. The strained silicon-on-insulator configuration offers various advantages associated with the insulating substrate, such as reduced parasitic capacitances and improved isolation. Strained Si provides improved carrier mobilities. Devices such as strained Si metal-oxide-semiconductor field-effect transistors (MOSFETs) combine enhanced carrier mobilities with the advantages of insulating substrates.

Strained-silicon-on-insulator substrates are typically fabricated as follows. First, a relaxed silicon-germanium (SiGe) layer is formed on an insulator by one of several techniques such as separation by implantation of oxygen (SIMOX), wafer bonding and etch back; wafer bonding and hydrogen exfoliation layer transfer; or recrystallization of amorphous material. Then, a strained Si layer is epitaxially grown to form a strained-silicon-on-insulator structure, with strained Si disposed over SiGe. The relaxed-SiGe-on-insulator layer serves as the template for inducing strain in the Si layer. This induced strain is typically greater than $10^{-3}$.

This structure has limitations. It is not conducive to the production of fully-depleted strained-semiconductor-on-insulator devices in which the layer over the insulating material must be thin enough [<300 angstroms (Å)] to allow for full depletion of the layer during device operation. Fully depleted transistors may be the favored version of SOI for MOSFET technologies beyond the 90 nm technology node. The relaxed SiGe layer adds to the total thickness of this layer and thus makes it difficult to achieve the thicknesses required for fully depleted silicon-on-insulator device fabrication. The relaxed SiGe layer is not required if a strained Si layer can be produced directly on the insulating material. Thus, there is a need for a method to produce strained silicon—or other semiconductor—layers directly on insulating substrates.

SUMMARY

The present invention includes a strained-semiconductor-on-insulator (SSOI) substrate structure and methods for fabricating the substrate structure. MOSFETs fabricated on this substrate will have the benefits of SOI MOSFETs as well as the benefits of strained Si mobility enhancement. By eliminating the SiGe relaxed layer traditionally found beneath the strained Si layer, the use of SSOI technology is simplified. For example, issues such as the diffusion of Ge into the strained Si layer during high temperature processes are avoided.

This approach enables the fabrication of well-controlled, epitaxially-defined, thin strained semiconductor layers directly on an insulator layer. Tensile strain levels of ~$10^{-3}$ or greater are possible in these structures, and are not diminished after thermal anneal cycles. In some embodiments, the strain-inducing relaxed layer is not present in the final structure, eliminating some of the key problems inherent to current strained Si-on-insulator solutions. This fabrication process is suitable for the production of enhanced-mobility substrates applicable to partially or fully depleted SSOI technology.

In an aspect, the invention features a structure including a substrate having a dielectric layer disposed thereon; and a first strained semiconductor layer disposed in contact with the dielectric layer, the semiconductor layer including approximately 100% germanium.

One or more of the following features may be included. The strained semiconductor layer may be compressively strained. The strained semiconductor layer may include a thin layer and the thin layer is disposed in contact with the dielectric layer. The thin layer may include silicon.

In another aspect, the invention features a substrate having a dielectric layer disposed thereon, a strained semiconductor layer disposed in contact with the dielectric layer, and a transistor. The transistor includes a source region and a drain region disposed in a portion of the strained semiconductor layer, and a gate disposed above the strained semiconductor layer and between the source and drain regions, the gate including a material selected from the group consisting of a doped semiconductor, a metal, and a metallic compound.

One or more of the following features may be included. The doped semiconductor may include polycrystalline silicon and/or polycrystalline silicon-germanium. The metal may include titanium, tungsten, molybdenum, tantalum, nickel, and/or iridium. The metal compound may include titanium nitride, titanium silicon nitride, tungsten nitride, tantalum nitride, tantalum silicide, nickel silicide, and/or iridium oxide. A contact layer may be disposed over at least a portion of the strained semiconductor layer, with a bottommost boundary of the contact layer being disposed above a bottommost boundary of the strained semiconductor layer. The contact layer may share an interface with the semiconductor layer.

In another aspect, the invention features a structure including a substrate having a dielectric layer disposed thereon, the dielectric layer having a melting point greater than about 1700° C., and a strained semiconductor layer disposed in contact with the dielectric layer.

The following features may be included. The dielectric layer may include aluminum oxide, magnesium oxide, and/or silicon nitride.

In another aspect, the invention features a structure including a substrate having a dielectric layer disposed thereon; and a strained semiconductor layer disposed in contact with the dielectric layer. The strained semiconductor layer includes approximately 100% silicon and has a misfit dislocation density of less than about $10^5$ cm/cm². In another aspect, the invention features a structure including a substrate having a dielectric layer disposed thereon, and a strained semiconductor layer disposed in contact with the dielectric layer. The strained semiconductor layer includes approximately 100% silicon and has a threading dislocation density selected from the range of about 10 dislocations/cm$^2$ to about 10$^7$ dislocations/cm$^2$.

In another aspect, the invention features a structure including a substrate having a dielectric layer disposed thereon and a strained semiconductor layer disposed in contact with the dielectric layer. The semiconductor layer includes approximately 100% silicon and has a surface roughness selected from the range of approximately 0.01 nm to approximately 1 mm.

In another aspect, the invention features a substrate having a dielectric layer disposed thereon, and a strained semiconductor layer disposed in contact with the dielectric layer. The strained semiconductor layer includes approximately 100% silicon and has a thickness uniformity across the substrate of better than approximately ±10%.

In another aspect, the invention features a structure including a substrate having a dielectric layer disposed thereon, and a strained semiconductor layer disposed in contact with the dielectric layer. The strained semiconductor layer includes approximately 100% silicon and has a thickness of less than approximately 200 Å.

In another aspect, the invention features a structure including a substrate having a dielectric layer disposed thereon, and a strained semiconductor layer disposed in contact with the dielectric layer. The semiconductor layer includes approximately 100% silicon and has a surface germanium concentration of less than approximately 1×10$^{12}$ atoms/cm$^2$.

In another aspect, the invention features a structure including a substrate having a dielectric layer disposed thereon, and a strained semiconductor layer disposed in contact with the dielectric layer. An interface between the strained semiconductor layer and the dielectric layer has a density of bonding voids of less than 0.3 voids/cm$^2$.

In another aspect, the invention features a method for forming a structure, the method including providing a first substrate comprising a porous layer defining a cleave plane and having a first strained semiconductor layer formed thereon. The first strained semiconductor layer is bonded to an insulator layer disposed on a second substrate, and removing the first substrate from the first strained semiconductor layer by cleaving at the cleave plane, the strained semiconductor layer remaining bonded to the insulator layer.

In another aspect, the invention features a method for forming a structure, the method including forming a first relaxed layer over a first substrate, the first relaxed layer including a porous layer defining a cleave plane. A strained semiconductor layer is formed over the first relaxed layer. The first strained semiconductor layer is bonded to an insulator layer disposed on a second substrate. The first substrate is removed from the strained semiconductor layer by cleaving at the cleave plane, the strained semiconductor layer remaining bonded to the insulator layer.

One or more of the following features may be included. The porous layer may be disposed at a top portion of the first relaxed layer. A second relaxed layer may be formed over the first relaxed layer, with the strained semiconductor layer being formed over the second relaxed layer. The first relaxed layer may be planarized, e.g., by chemical-mechanical polishing, prior to forming the second relaxed layer. At least a portion of the porous layer may remain disposed on the first strained semiconductor layer after cleaving. The portion of the porous layer may be removed from the strained semiconductor layer after cleaving. The portion of the porous layer may be removed by cleaning with a wet chemical solution that may include, e.g., hydrogen peroxide and/or hydrofluoric acid. Removing the portion of the porous layer may include oxidation.

Like-referenced features represent common features in corresponding drawings.

DETAILED DESCRIPTION

An SSOI structure may be formed by wafer bonding followed by cleaving. FIGS. 1A-2B illustrate formation of a suitable strained layer on a wafer for bonding, as further described below.

Figure 1B:
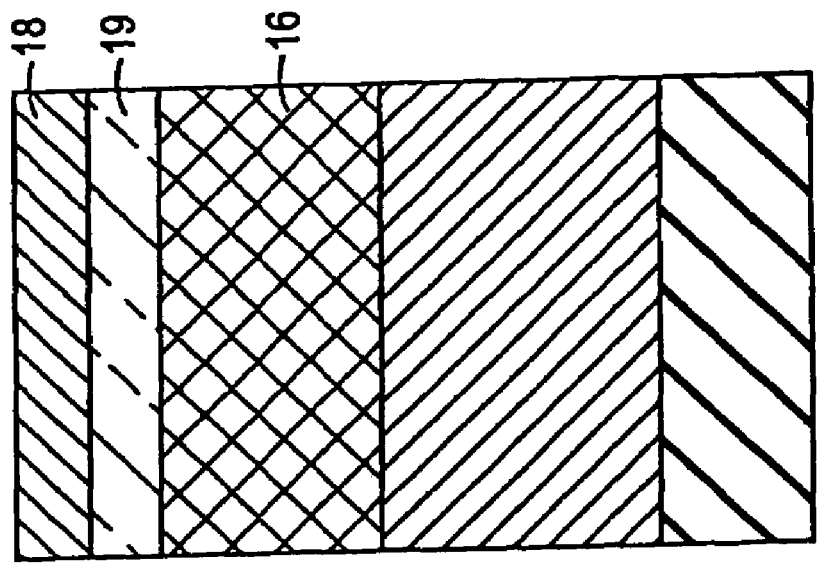
FIGS. 1A, 1B, 2A, 2B, and 3-6 are schematic cross-sectional views of substrates illustrating a method for fabricating an SSOI substrate.
Figure 1A:
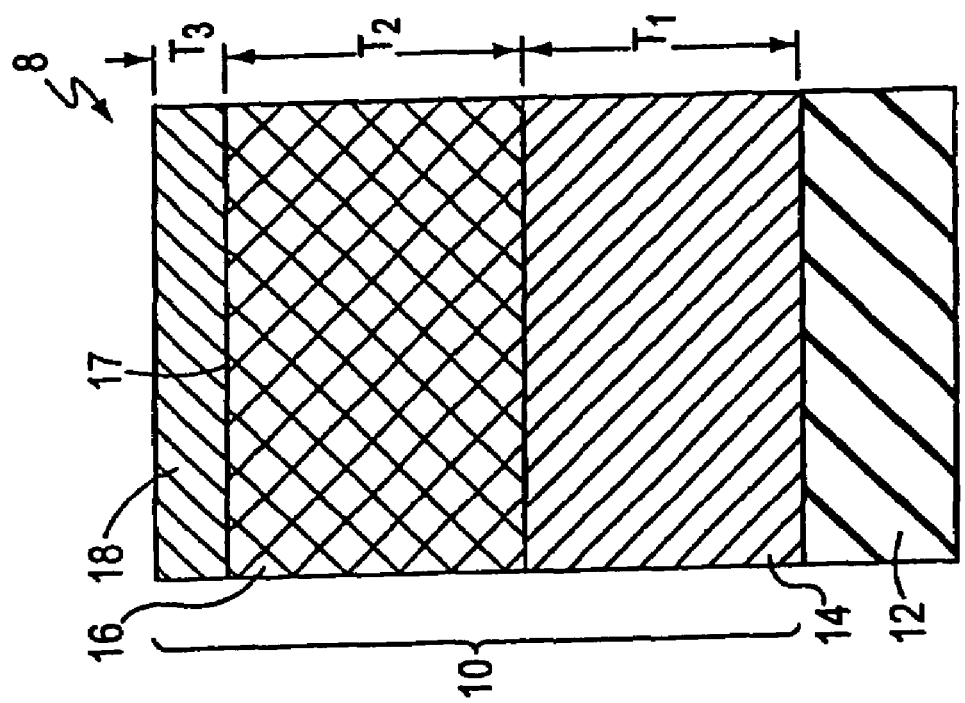

Referring to FIG. 1A, an epitaxial wafer 8 has a plurality of layers 10 disposed over a substrate 12. Substrate 12 may be formed of a semiconductor, such as Si, Ge, or SiGe. The plurality of layers 10 includes a graded buffer layer 14, which may be formed of $Si_{1-y}Ge_y$, with a maximum Ge content of, e.g., 10-80% (i.e., y=0.1-0.8) and a thickness $T_1$ of, for example, 1-8 micrometers (μm).

A relaxed layer 16 is disposed over graded buffer layer 14. Relaxed layer 16 may be formed of uniform $Si_{1-x}Ge_x$ having a Ge content of, for example, 10-80% (i.e., x=0.1-0.8), and a thickness $T_2$ of, for example, 0.2-2 μm. In some embodiments, $Si_{1-x}Ge_x$ may include $Si_{0.70}Ge_{0.30}$ and $T_2$ may be approximately 1.5 μm. Relaxed layer 16 may be fully relaxed, as determined by triple axis X-ray diffraction, and may have a threading dislocation density of <1×10$^6$ dislocations/cm$^2$, as determined by etch pit density (EPD) analysis. Because threading dislocations are linear defects disposed within a volume of crystalline material, threading dislocation density may be measured as either the number of dislocations intersecting a unit area within a unit volume or the line length of dislocation per unit volume. Threading dislocation density therefore, may, be expressed in either units of dislocations/cm$^2$ or cm/cm$^3$. Relaxed layer 16 may have a surface particle density of, e.g., less than about 0.3 particles/cm$^2$. Further, relaxed layer 16 produced in accordance with the present invention may have a localized light-scattering defect level of less than about 0.3 defects/cm$^2$ for particle defects having a size (diameter) greater than 0.13 microns, a defect level of about 0.2 defects/cm$^2$ for particle defects having a size greater than 0.16 microns, a defect level of about 0.1 defects/cm$^2$ for particle defects having a size greater than 0.2 microns, and a defect level of about 0.03 defects/cm$^2$ for defects having a size greater than 1 micron. Process optimization may enable reduction of the localized light-scattering defect levels to about 0.09 defects/cm$^2$ for particle defects having a size greater than 0.09 microns and to 0.05 defects/cm$^2$ for particle defects having a size greater than 0.12 microns.

Substrate 12, graded layer 14, and relaxed layer 16 may be formed from various materials systems, including various combinations of group II, group III, group IV, group V, and group VI elements. For example, each of substrate 12, graded layer 14, and relaxed layer 16 may include a III-V compound. Substrate 12 may include gallium arsenide (GaAs), graded layer 14 and relaxed layer 16 may include indium gallium arsenide (InGaAs) or aluminum gallium arsenide (AlGaAs). These examples are merely illustrative, and many other material systems are suitable.

A strained semiconductor layer 18 is disposed over relaxed layer 16. Strained layer 18 may include a semiconductor such as at least one of a group II, a group III, a group IV, a group V, and a group VI element. Strained semiconductor layer 18 may include, for example, Si, Ge, SiGe, GaAs, indium phosphide (InP), and/or zinc selenide (ZnSe). In some embodiments, strained semiconductor layer 18 may include approximately 100% Ge, and may be compressively strained. Strained semiconductor layer 18 comprising 100% Ge may be formed over, e.g., relaxed layer 16 containing uniform $Si_{1-x}Ge_x$ having a Ge content of, for example, 50-80% (i.e., x=0.5-0.8), preferably 70% (x=0.7). Strained layer 18 has a thickness $T_3$ of, for example, 50-1000 Å. In an embodiment, $T_3$ may be approximately 200-500 Å.

Strained layer 18 may be formed by epitaxy, such as by atmospheric-pressure CVD (APCVD), low- (or reduced-) pressure CVD (LPCVD), ultra-high-vacuum CVD (UH-VCVD), by molecular beam epitaxy (MBE), or by atomic layer deposition (ALD). Strained layer 18 containing Si may be formed by CVD with precursors such as silane, disilane, or trisilane. Strained layer 18 containing Ge may be formed by CVD with precursors such as germane or digermane. The epitaxial growth system may be a single-wafer or multiple-wafer batch reactor. The growth system may also utilize a low-energy plasma to enhance layer growth kinetics. Strained layer 18 may be formed at a relatively low temperature, e.g., less than 700° C., to facilitate the definition of an abrupt interface 17 between strained layer 18 and relaxed layer 16. This abrupt interface 17 may enhance the subsequent separation of strained layer 18 from relaxed layer 16, as discussed below with reference to FIGS. 4 and 5. Abrupt interface 17 is characterized by the transition of Si or Ge content (in this example) proceeding in at least 1 decade (order of magnitude in atomic concentration) per nanometer of depth into the sample. In an embodiment, this abruptness may be better than 2 decades per nanometer.

In an embodiment in which strained layer 18 contains substantially 100% Si, strained layer 18 may be formed in a dedicated chamber of a deposition tool that is not exposed to Ge source gases, thereby avoiding cross-contamination and improving the quality of the interface between strained layer 18 and relaxed layer 16. Furthermore, strained layer 18 may be formed from an isotopically pure silicon precursor(s). Isotopically pure Si has better thermal conductivity than conventional Si. Higher thermal conductivity may help dissipate heat from devices subsequently formed on strained layer 18, thereby maintaining the enhanced carrier mobilities provided by strained layer 18.

After formation, strained layer 18 has an initial misfit dislocation density, of, for example, 0-10$^5$ cm/cm$^2$. In an embodiment, strained layer 18 has an initial misfit dislocation density of approximately 0 cm/cm$^2$. Because misfit dislocations are linear defects generally lying within a plane between two crystals within an area, they may be measured in terms of total line length per unit area. Misfit dislocation density, therefore, may be expressed in units of dislocations/cm or cm/cm$^2$. In one embodiment, strained layer 18 is tensilely strained, e.g., Si formed over SiGe. In another embodiment, strained layer 18 is compressively strained, e.g., Ge formed over SiGe.

Strained layer 18 may have a surface particle density of, e.g., less than about 0.3 particles/cm$^2$. As used herein, "surface particle density" includes not only surface particles but also light-scattering defects, and crystal-originated pits (COPs), and other defects incorporated into strained layer 18. Further, strained layer 18 produced in accordance with the present invention may have a localized light-scattering defect level of less than about 0.3 defects/cm$^2$ for particle defects having a size (diameter) greater than 0.13 microns, a defect level of about 0.2 defects/cm$^2$ for particle defects having a size greater than 0.16 microns, a defect level of about 0.1 defects/cm$^2$ for particle defects having a size greater than 0.2 microns, and a defect level of about 0.03 defects/cm$^2$ for defects having a size greater than 1 micron. Process optimization may enable reduction of the localized light-scattering defect levels to about 0.09 defects/cm$^2$ for particle defects having a size greater than 0.09 microns and to 0.05 defects/cm$^2$ for particle defects having a size greater than 0.12 microns. These surface particles may be incorporated in strained layer 18 during the formation of strained layer 18, or they may result from the propagation of surface defects from an underlying layer, such as relaxed layer 16.

In alternative embodiments, graded layer 14 may be absent from the structure. Relaxed layer 16 may be formed in various ways, and the invention is not limited to embodiments having graded layer 14. In other embodiments, strained layer 18 may be formed directly on substrate 12. In this case, the strain in layer 18 may be induced by lattice mismatch between layer 18 and substrate 12, induced mechanically, e.g., by the deposition of overlayers, such as $Si_3N_4$, or induced by thermal mismatch between layer 18 and a subsequently grown layer, such as a SiGe layer. In some embodiments, a uniform semiconductor layer (not shown), having a thickness of approximately 0.5 μm and comprising the same semiconductor material as substrate 12, is disposed between graded buffer layer 14 and substrate 12. This uniform semiconductor layer may be grown to improve the material quality of layers subsequently grown on substrate 12, such as graded buffer layer 14, by providing a clean, contaminant-free surface for epitaxial growth. In certain embodiments, relaxed layer 16 may be planarized prior to growth of strained layer 18 to eliminate the cross-hatched surface roughness induced by graded buffer layer 14. (See, e.g., M. T. Currie, et al., *Appl. Phys. Lett.*, 72 (14) p. 1718 (1998), incorporated herein by reference.) The planarization may be performed by a method such as chemical mechanical polishing (CMP), and may improve the quality of a subsequent bonding process (see below) because it minimizes the wafer surface roughness and increases wafer flatness, thus providing a greater surface area for bonding.

Referring to FIG. 1B, after planarization of relaxed layer 16, a relaxed semiconductor regrowth layer 19 including a semiconductor such as SiGe may be grown on relaxed layer 16, thus improving the quality of subsequent strained layer

18 growth by ensuring a clean surface for the growth of strained layer 18. Growing on this clean surface may be preferable to growing strained material, e.g., silicon, on a surface that is possibly contaminated by oxygen and carbon from the planarization process. The conditions for epitaxy of the relaxed semiconductor regrowth layer 19 on the planarized relaxed layer 16 should be chosen such that surface roughness of the resulting structure, including layers formed over regrowth layer 19, is minimized to ensure a surface suitable for subsequent high quality bonding. High quality bonding may be defined as the existence of a bond between two wafers that is substantially free of bubbles or voids at the interface. Measures that may help ensure a smooth surface for strained layer 18 growth, thereby facilitating bonding, include substantially matching a lattice of the semiconductor regrowth layer 19 to that of the underlying relaxed layer 16, by keeping the regrowth thickness below approximately 1 µm, and/or by keeping the growth temperature below approximately 850° C. for at least a portion of the semiconductor layer 19 growth. It may also be advantageous for relaxed layer 16 to be substantially free of particles or areas with high threading dislocation densities (i.e., threading dislocation pile-ups) which could induce non-planarity in the regrowth and decrease the quality of the subsequent bond.

Figure 2B:
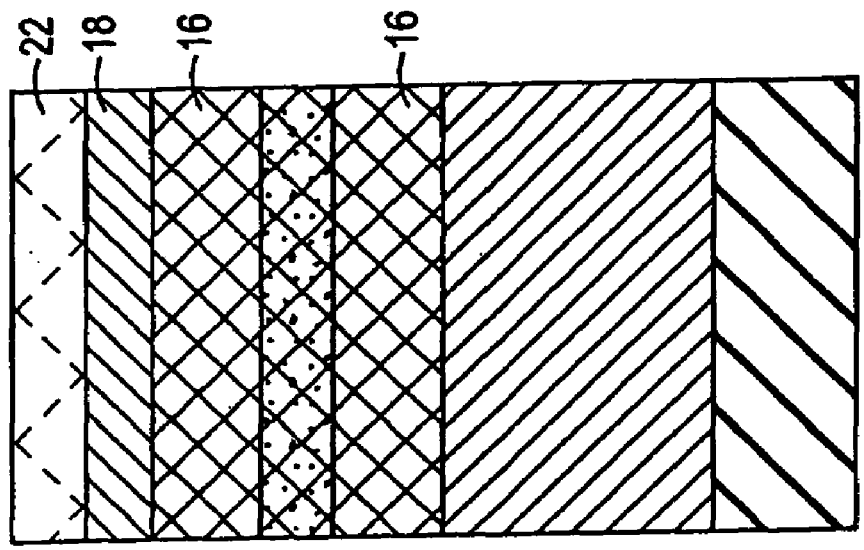
Figure 2A:
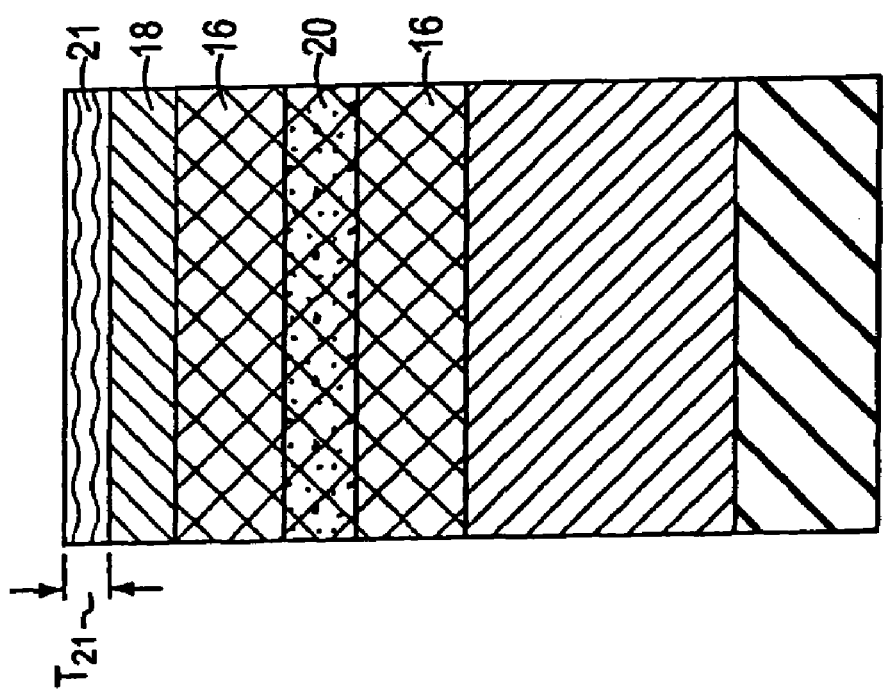

Referring to FIG. 2A, in an embodiment, hydrogen ions are implanted into relaxed layer 16 to define a cleave plane 20. This implantation is similar to the SMARTCUT process that has been demonstrated in silicon by, e.g., SOITEC, based in Grenoble, France. Implantation parameters may include implantation of hydrogen ($H_2^+$) to a dose of 2.5-5× $10^{16}$ ions/cm$^2$ at an energy of, e.g., 50-100 keV. For example, $H_2^+$ may be implanted at an energy of 75 keV and a dose of 4×$10^{16}$ ions/cm$^2$ through strained layer 18 into relaxed layer 16. In alternative embodiments, it may be favorable to implant at energies less than 50 keV to decrease the depth of cleave plane 20 and decrease the amount of material subsequently removed during the cleaving process (see discussion below with reference to FIG. 4). In an alternative embodiment, other implanted species may be used, such as $H^+$ or $He^+$, with the dose and energy being adjusted accordingly. The implantation may also be performed prior to the formation of strained layer 18. Then, the subsequent growth of strained layer 18 is preferably performed at a temperature low enough to prevent premature cleaving along cleave plane 20, i.e., prior to the wafer bonding process. This cleaving temperature is a complex function of the implanted species, implanted dose, and implanted material. Typically, premature cleaving may be avoided by maintaining a growth temperature below approximately 500° C.

Figure 3:
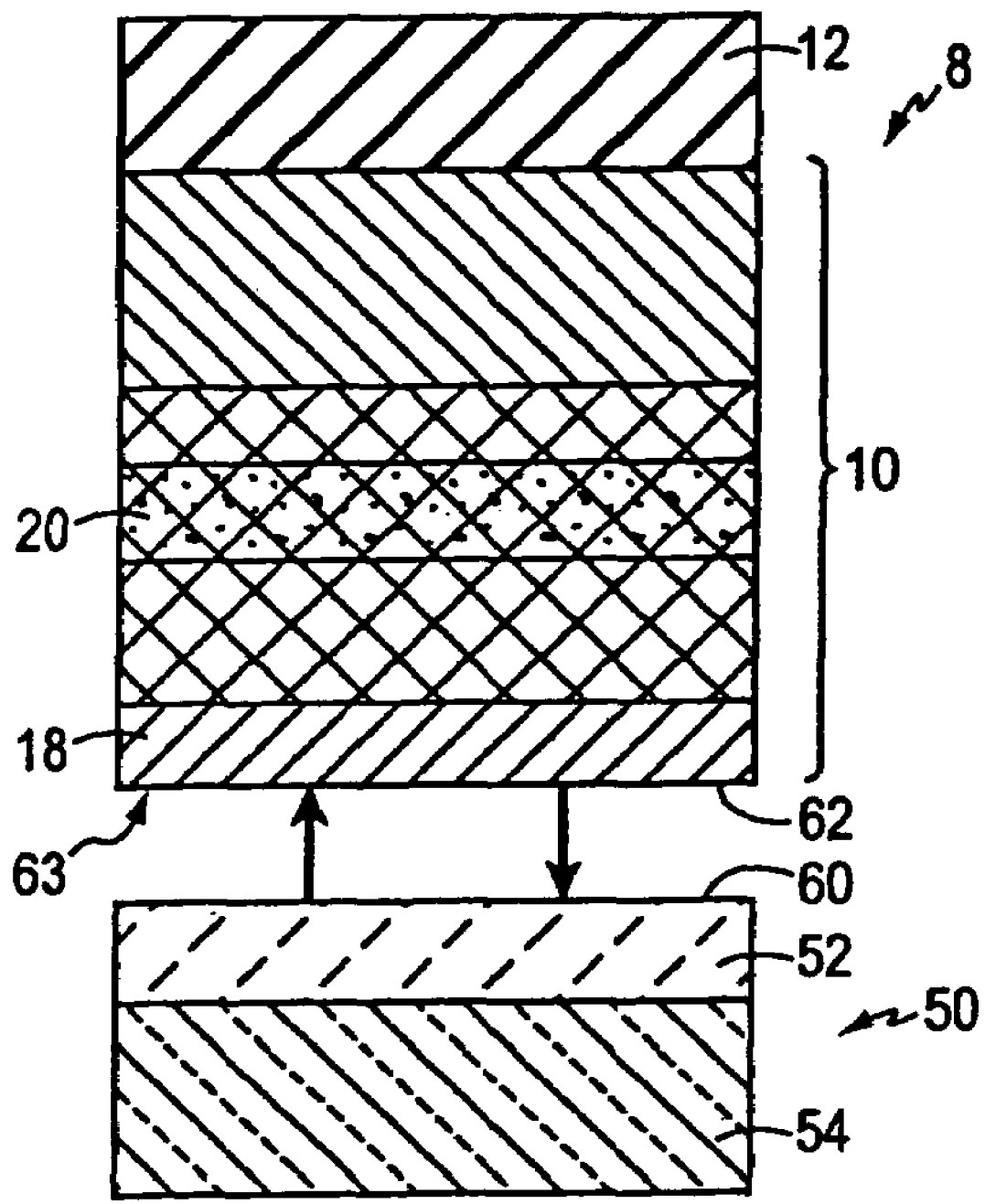

In some embodiments, such as when strained layer 18 comprises nearly 100% Ge, a thin layer 21 of another material, such as Si, may be formed over strained layer 18 prior to bonding (see discussion with respect to FIG. 3). This thin layer 21 may be formed to enhance subsequent bonding of strained layer 18 to an insulator, such as an oxide. Thin layer 21 may have a thickness $T_{21}$ of, for example, 0.5-5 mm.

In some embodiments, strained layer 18 may be planarized by, e.g., CMP, to improve the quality of the subsequent bond. Strained layer 18 may have a low surface roughness, e.g., less than 0.5 nm root mean square (RMS). Referring to FIG. 2B, in some embodiments, a dielectric layer 22 may be formed over strained layer 18 prior to ion implantation into relaxed layer 16 to improve the quality of the subsequent bond. Dielectric layer 22 may be, e.g., silicon dioxide ($SiO_2$) deposited by, for example, LPCVD or by high density plasma (HDP). An LPCVD deposited $SiO_2$ layer may be subjected to a densification step at elevated temperature. Suitable conditions for this densification step may be, for example, a 10 minute anneal at 800° C. in a nitrogen ambient. Alternatively, dielectric layer 22 may include low-temperature oxide (LTO), which may be subsequently densified at elevated temperature in nitrogen or oxygen ambients. Suitable conditions for this densification step can be a 10 minute anneal at 800° C. in an oxygen ambient. Dielectric layer 22 may be planarized by, e.g., CMP to improve the quality of the subsequent bond. In an alternative embodiment, it may be advantageous for dielectric layer 22 to be formed from thermally grown $SiO_2$ in order to provide a high quality semiconductor/dielectric interface in the final structure. In an embodiment, strained layer 18 comprises approximately 100% Ge and dielectric layer 22 comprises, for example, germanium dioxide ($GeO_2$); germanium oxynitride (GeON); a high-k insulator having a higher dielectric constant than that of $SiO_2$ such as hafnium oxide ($HfO_2$) or hafnium silicate (HfSiON, $HfSiO_4$); or a multilayer structure including $GeO_2$ and $SiO_2$. Ge has an oxidation behavior different from that of Si, and the deposition methods may be altered accordingly.

Referring to FIG. 3, epitaxial wafer 8 is bonded to a handle wafer 50. Either handle wafer 50, epitaxial wafer 8, or both have a top dielectric layer (see, e.g., dielectric layer 22 in FIG. 2B) to facilitate the bonding process and to serve as an insulator layer in the final substrate structure. Handle wafer 50 may have a dielectric layer 52 disposed over a semiconductor substrate 54. Dielectric layer 52 may include, for example, $SiO_2$. In an embodiment, dielectric layer 52 includes a material having a melting point ($T_m$) higher than a $T_m$ of pure $SiO_2$, i.e., higher than 1700° C. Examples of such materials are silicon nitride ($Si_3N_4$), aluminum oxide, magnesium oxide, etc. Using dielectric layer 52 with a high $T_m$ helps prevents possible relaxation of the transferred strained semiconductor layer 18 that may occur during subsequent processing, due to softening of the underlying dielectric layer 52 at temperatures typically used during device fabrication (approximately 1000-1200° C.). In other embodiments, handle wafer 50 may include a combination of a bulk semiconductor material and a dielectric layer, such as a silicon on insulator substrate. Semiconductor substrate 54 includes a semiconductor material such as, for example, Si, Ge, or SiGe.

Handle wafer 50 and epitaxial wafer 8 are cleaned by a wet chemical cleaning procedure to facilitate bonding, such as by a hydrophilic surface preparation process to assist the bonding of a semiconductor material, e.g., strained layer 18, to a dielectric material, e.g., dielectric layer 52. For example, a suitable prebonding surface preparation cleaning procedure could include a modified megasonic RCA SC1 clean containing ammonium hydroxide, hydrogen peroxide, and water ($NH_4OH:H_2O_2:H_2O$) at a ratio of 1:4:20 at 60° C. for 10 minutes, followed by a deionized (DI) water rinse and spin dry. The wafer bonding energy should be strong enough to sustain the subsequent layer transfer (see FIG. 4). In some embodiments, top surfaces 60, 62 of handle wafer 50 and epitaxial wafer 8, including a top surface 63 of strained semiconductor layer 18, may be subjected to a plasma activation, either before, after, or instead of a wet clean, to increase the bond strength. The plasma environment may include at least one of the following species: oxygen, ammonia, argon, nitrogen, diborane, and phosphine. After an appropriate cleaning step, handle wafer 50 and epitaxial wafer 8 are bonded together by bringing top surfaces 60, 62 in contact with each other at room temperature. The bond strength may be greater than 1000 mJ/m², achieved at a low temperature, such as less than 600° C.

Figure 4:
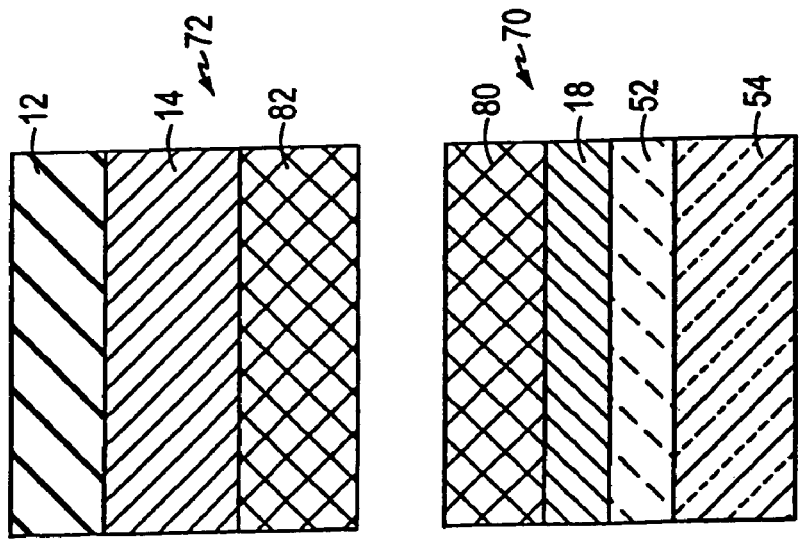

Referring to FIG. 4 as well as to FIG. 3, a split is induced at cleave plane 20 by annealing handle wafer 50 and epitaxial wafer 8 after they are bonded together. This split may be induced by an anneal at 300-700° C., e.g., 550° C., inducing hydrogen exfoliation layer transfer (i.e., along cleave plane 20) and resulting in the formation of two separate wafers 70, 72. One of these wafers (70) has a first portion 80 of relaxed layer 16 (see FIG. 1A) disposed over strained layer 18. Strained layer 18 is in contact with dielectric layer 52 on semiconductor substrate 54. The other of these wafers (72) includes substrate 12, graded layer 14, and a remaining portion 82 of relaxed layer 16. In some embodiments, wafer splitting may be induced by mechanical force in addition to or instead of annealing. If necessary, wafer 70 with strained layer 18 may be annealed further at 600-900° C., e.g., at a temperature greater than 800° C., to strengthen the bond between the strained layer 18 and dielectric layer 52. In some embodiments, this anneal is limited to an upper temperature of about 900° C. to avoid the destruction of a strained Si/relaxed SiGe heterojunction by diffusion. Wafer 72 may be planarized, and used as starting substrate 8 for growth of another strained layer 18. In this manner, wafer 72 may be "recycled" and the process illustrated in FIGS. 1A-5 may be repeated. An alternative "recyling" method may include providing relaxed layer 16 that is several microns thick and repeating the process illustrated in FIG. 1A-5, starting with the formation of hydro-strained layer 18. Because the formation of this thick relaxed layer 16 may lead to bowing of substrate 12, a layer including, e.g., oxide or nitride, may be formed on the backside of substrate 12 to counteract the bowing. Alternatively substrate 12 may be pre-bowed when cut and polished, in anticipation of the bow being removed by the formation of thick relaxed layer 16.

Figure 5:
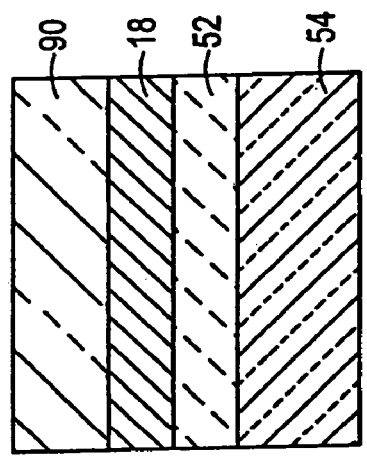

Referring to FIG. 4 as well as to FIG. 5, relaxed layer portion 80 is removed from strained layer 18. In an embodiment, removal of relaxed layer portion 80, containing, e.g., SiGe, includes oxidizing the relaxed layer portion 80 by wet (steam) oxidation. For example, at temperatures below approximately 800° C., such as temperatures between 600-750° C., wet oxidation will oxidize SiGe much more rapidly then Si, such that the oxidation front will effectively stop when it reaches the strained layer 18, in embodiments in which strained layer 18 includes Si. The difference between wet oxidation rates of SiGe and Si may be even greater at lower temperatures, such as approximately 400° C.-600° C. Good oxidation selectivity is provided by this difference in oxidation rates, i.e., SiGe may be efficiently removed at low temperatures with oxidation stopping when strained layer 18 is reached. This wet oxidation results in the transformation of SiGe to a thermal insulator 90, e.g., $Si_xGe_yO_z$. The thermal insulator 90 resulting from this oxidation is removed in a selective wet or dry etch, e.g., wet hydrofluoric acid. In some embodiments, it may be more economical to oxidize and strip several times, instead of just once.

In certain embodiments, wet oxidation may not completely remove the relaxed layer portion 80. Here, a localized rejection of Ge may occur during oxidation, resulting in the presence of a residual Ge-rich SiGe region at the oxidation front, on the order of, for example, several nanometers in lateral extent. A surface clean may be performed to remove this residual Ge. For example, the residual Ge may be removed by a dry oxidation at, e.g., 600° C., after the wet oxidation and strip described above. Another wet clean may be performed in conjunction with—or instead of—the dry oxidation. Examples of possible wet etches for removing residual Ge include a Piranha etch, i.e., a wet etch that is a mixture of sulfuric acid and hydrogen peroxide ($H_2SO_4$: $H_2O_2$) at a ratio of, for example, 3:1. An HF dip may be performed after the Piranha etch. Alternatively, an RCA SC1 clean may be used to remove the residual Ge. The process of Piranha or RCA SC1 etching and HF removal of resulting oxide may be repeated more than once. In an embodiment, relaxed layer portion including, e.g., SiGe, is removed by etching and annealing under a hydrochloric acid (HCl) ambient.

In the case of a strained Si layer, the surface Ge concentration of the final strained Si surface is preferably less than about $1 \times 10^{12}$ atoms/cm² when measured by a technique such as total reflection x-ray fluorescence (TXRF) or the combination of vapor phase decomposition (VPD) with a spectroscopy technique such as graphite furnace atomic absorption spectroscopy (GFAAS) or inductively-coupled plasma mass spectroscopy (ICP-MS). In some embodiments, after cleaving, a planarization step or a wet oxidation step may be performed to remove a portion of the damaged relaxed layer portion 80 as well as to increase the smoothness of its surface. A smoother surface may improve the uniformity of subsequent complete removal of a remainder of relaxed layer portion 80 by, e.g., wet chemical etching. After removal of relaxed layer portion 80, strained layer 18 may be planarized. Planarization of strained layer 18 may be performed by, e.g., CMP; an anneal at a temperature greater than, for example, 800° C., in a hydrogen ($H_2$) or hydrochloric acid (HCl) containing ambient; or cluster ion beam smoothing.

Figure 6:
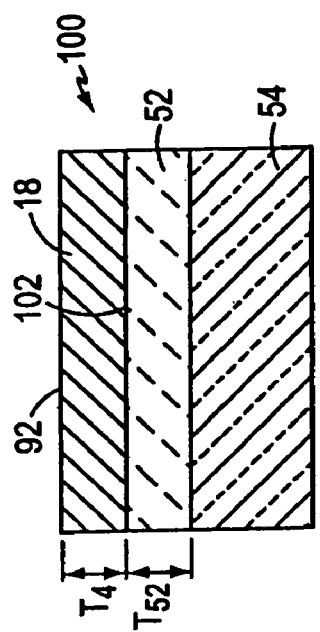

Referring to FIG. 6, a SSOI substrate 100 has strained layer 18 disposed over an insulator, such as dielectric layer 52 formed on semiconductor substrate 54. Strained layer 18 has a thickness $T_4$ selected from a range of, for example, 50-1000 Å, with a thickness uniformity of better than approximately ±5% and a surface roughness of less than approximately 20 Å. Dielectric layer 52 has a thickness $T_{52}$ selected from a range of, for example, 500-3000 Å. In an embodiment, strained layer 18 includes approximately 100% Si or 100% Ge having one or more of the following material characteristics: misfit dislocation density of, e.g., $0-10^5$ cm/cm²; a threading dislocation density of about $10^1$-$10^7$ dislocations/cm²; a surface roughness of approximately 0.01-1 nm RMS; and a thickness uniformity across SSOI substrate 100 of better than approximately ±10% of a mean desired thickness; and a thickness $T_4$ of less than approximately 200 Å. In an embodiment, SSOI substrate 100 has a thickness uniformity of better than approximately ±5% of a mean desired thickness.

In an embodiment, dielectric layer 52 has a $T_m$ greater than that of $SiO_2$. During subsequent processing, e.g., MOSFET formation, SSOI substrate 100 may be subjected to high temperatures, i.e., up to 1100° C. High temperatures may result in the relaxation of strained layer 18 at an interface between strained layer 18 and dielectric layer 52. The use of dielectric layer with a $T_m$ greater than 1700° C. may help keep strained layer 18 from relaxing at the interface between strained layer 18 and dielectric layer 52 when SSOI substrate is subjected to high temperatures.

In an embodiment, the misfit dislocation density of strained layer 18 may be lower than its initial dislocation density. The initial dislocation density may be lowered by, for example, performing an etch of a top surface 92 of strained layer 18. This etch may be a wet etch, such as a standard microelectronics clean step such as an RCA SC1, i.e., hydrogen peroxide, ammonium hydroxide, and water ($H_2O_2$+$NH_4OH$+$H_2O$), which at, e.g., 80° C. may remove silicon.

The presence of surface particles on strained layer 18, as described above with reference to FIG. 1A, may result in the formation of bonding voids at an interface 102 between strained layer 18 and dielectric layer 52. These bonding voids may have a density equivalent to the density of surface particles formed on strained layer 18, e.g., less than about 0.3 voids/cm$^2$.

In some embodiments, strained semiconductor layer 18 includes Si and is substantially free of Ge; further, any other layer disposed in contact with strained semiconductor layer 18 prior to device processing, e.g., dielectric layer 52, is also substantially free of Ge.

Figure 7:
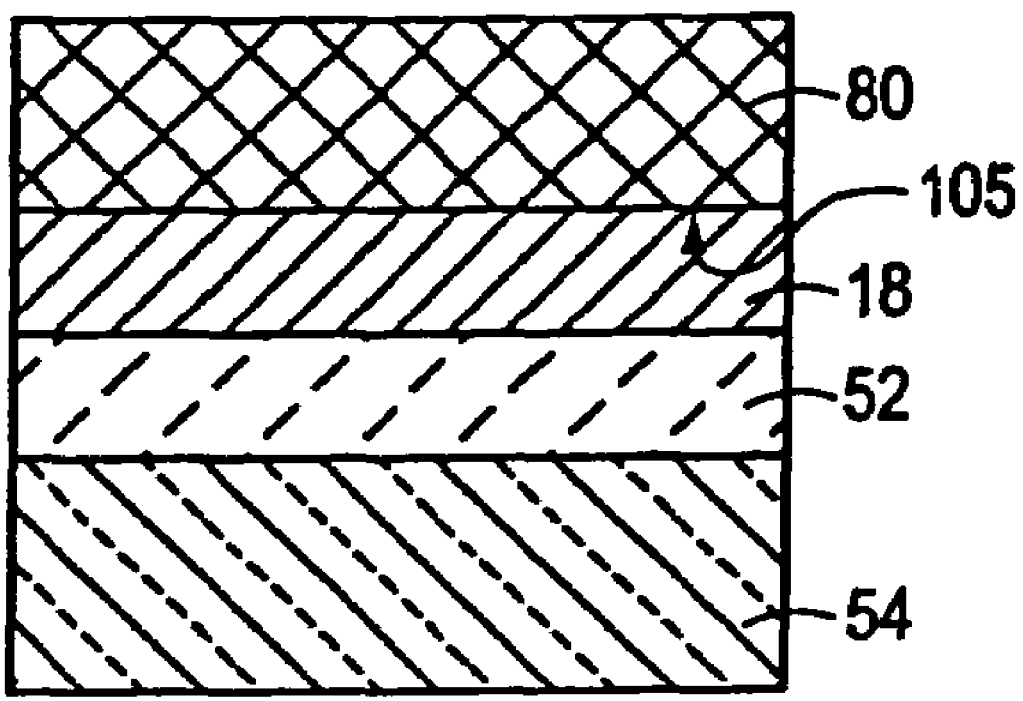
FIG. 7 is a schematic cross-sectional view illustrating an alternative method for fabricating the SSOI substrate illustrated in FIG. 6.

Referring to FIG. 7, in an alternative embodiment, relaxed layer portion 80 may be removed by a selective wet etch that stops at the strained layer 18 to obtain SSOI substrate 100 (see FIG. 6). In embodiments in which relaxed layer portion 80 contains SiGe, a suitable selective SiGe wet etch may be a solution containing nitric acid ($HNO_3$) and dilute HF at a ratio of 3:1 or a solution containing $H_2O_2$, HF, and acetic acid ($CH_3COOH$) at a ratio of 2:1:3. Alternatively, relaxed layer portion 80 may be removed by a dry etch that stops at strained layer 18. In some embodiments, relaxed layer portion 80 may be removed completely or in part by a chemical-mechanical polishing step or by mechanical grinding.

Figure 8A:
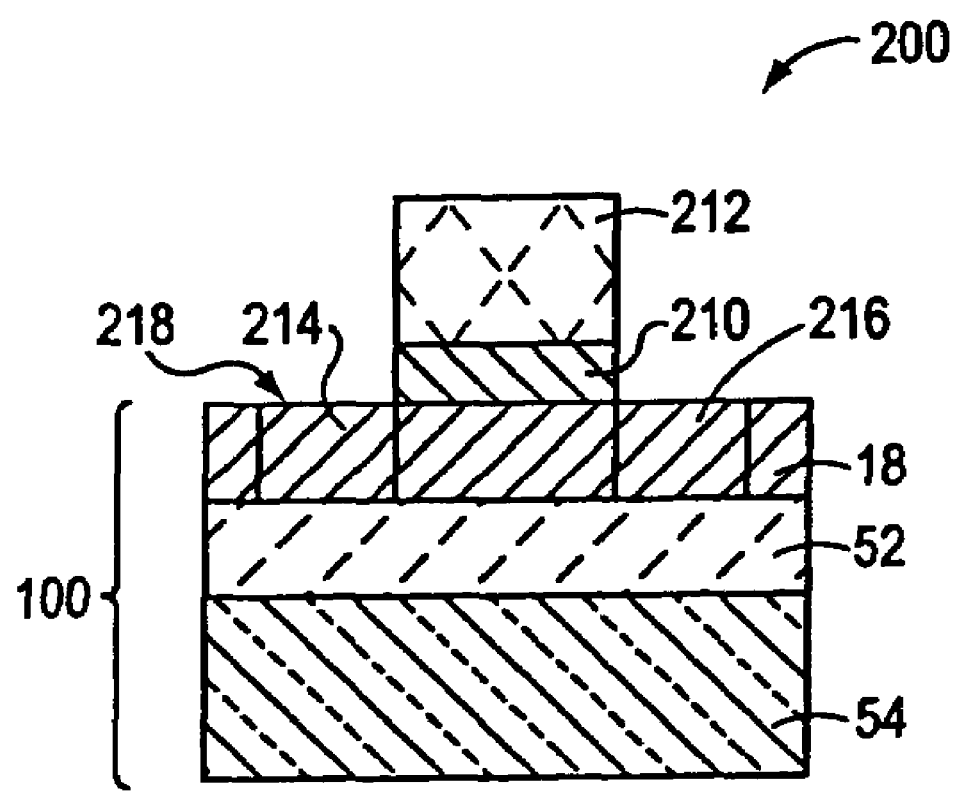
FIG. 8 is a schematic cross-sectional view of a transistor formed on the SSOI substrate illustrated in FIG. 6.

Strained semiconductor-on-insulator substrate 100 may be further processed by CMOS SOI MOSFET fabrication methods. For example, referring to FIG. 8A, a transistor 200 may be formed on SSOI substrate 100. Forming transistor 200 includes forming a gate dielectric layer 210 above strained layer 18 by, for example, growing an $SiO_2$ layer by thermal oxidation. Alternatively, gate dielectric layer 210 may include a high-k material with a dielectric constant higher than that of $SiO_2$, such as $HfO_2$, HfSiON, or $HfSiO_4$. In some embodiments, gate dielectric layer 210 may be a stacked structure, e.g., a thin $SiO_2$ layer capped with a high-k material. A gate 212 is formed over gate dielectric layer 210. Gate 212 may be formed of a conductive material, such as doped semiconductor, e.g., polycrystalline Si or polycrystalline SiGe; a metal, e.g., titanium (Ti), tungsten (W), molybdenum (Mo), tantalum (Ta), nickel (Ni), or iridium (Ir); or metal compounds, e.g., titanium nitride (TiN), titanium silicon nitride (TiSiN), tungsten nitride (WN), tantalum nitride (TaN), tantalum silicide (TaSi), nickel silicide (NiSi), or iridium oxide ($IrO_2$), that provide an appropriate workfunction. A source region 214 and a drain region 216 are formed in a portion 218 of strained semiconductor layer 18, proximate gate dielectric layer 210. Source and drain regions 214, 216 may be formed by, e.g., ion implantation of either n-type or p-type dopants.

In some embodiments, strained semiconductor layer 18 may be compressively strained when, for example, layer 18 includes strained Ge. Compressively strained layers may be prone to undulation when subjected to large temperature changes. The risk of such undulation may be reduced by reducing the thermal budget of a process for fabricating devices, such as transistor 200. The thermal budget may reduced by, for example, using atomic layer deposition (ALD) to deposit gate dielectric layer 210. Furthermore, a maximum temperature for forming gate 212 may be limited to, e.g., 600° C. by, for example, the use of materials comprising metal or metal compounds, rather than polysilicon or other gate materials that may require higher formation and/or dopant activation temperatures.

Figure 8B:
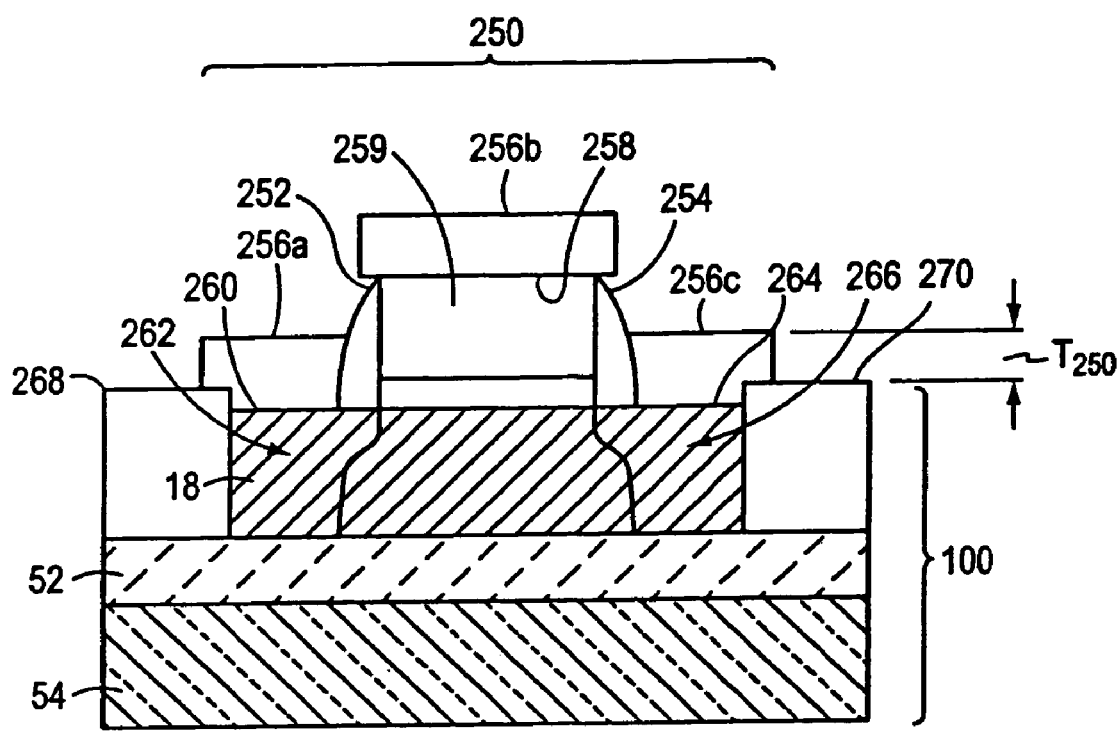

Referring to FIG. 8B, a transistor 250 formed on SSOI substrate 100 may have an elevated source region and an elevated drain region proximate a first and a second sidewall spacer 252, 254. These elevated regions may be formed as follows. A semiconductor layer 256a-256c is formed selectively on exposed silicon surfaces, i.e., on top surface 258 of a gate 259 containing silicon, a top surface 260 of a source 262 defined in strained layer 18, and top surface 264 of a drain 266 defined in strained layer 18. In an embodiment, semiconductor layer 256a-256c is an epitaxial layer, such as epitaxial silicon, epitaxial germanium, or epitaxial silicon-germanium. No semiconductor layer is formed on non-silicon features, such as sidewall spacers 252, 254 and dielectric isolation regions 268, 270. Semiconductor layer 256a-256c has a thickness $T^{256}$ of, for example, approximately 100-500 Å.

Semiconductor layer 256a-256c has a low resistivity of, e.g., 0.001 ohm-cm, that facilitates the formation of low-resistance contacts. To achieve this low resistivity, semiconductor layer 256a-256c is, for example, epitaxial silicon doped with, for example, arsenic to a concentration of $1 \times 10^{20}$ atoms/cm$^3$. Semiconductor layer 256a-256c may be doped in situ, during deposition. In alternative embodiments, semiconductor layer 256a-256c may be doped after deposition by ion implantation or by gas-, plasma- or solid-source diffusion. In some embodiments, the doping of semiconductor layer 256a-256c and the formation of source 262 and drain 266 are performed simultaneously. Portions of semiconductor layer 256a, 256c disposed over source 262 and drain 266 may have top surfaces substantially free of facets. In an embodiment, portions of source 262, drain 266, and/or gate 259 may be etched away to define recess prior to deposition of semiconductor layer 256a-256c, and semiconductor layer 256a-256c may then be deposited in the recesses thus formed.

Figure 8C:
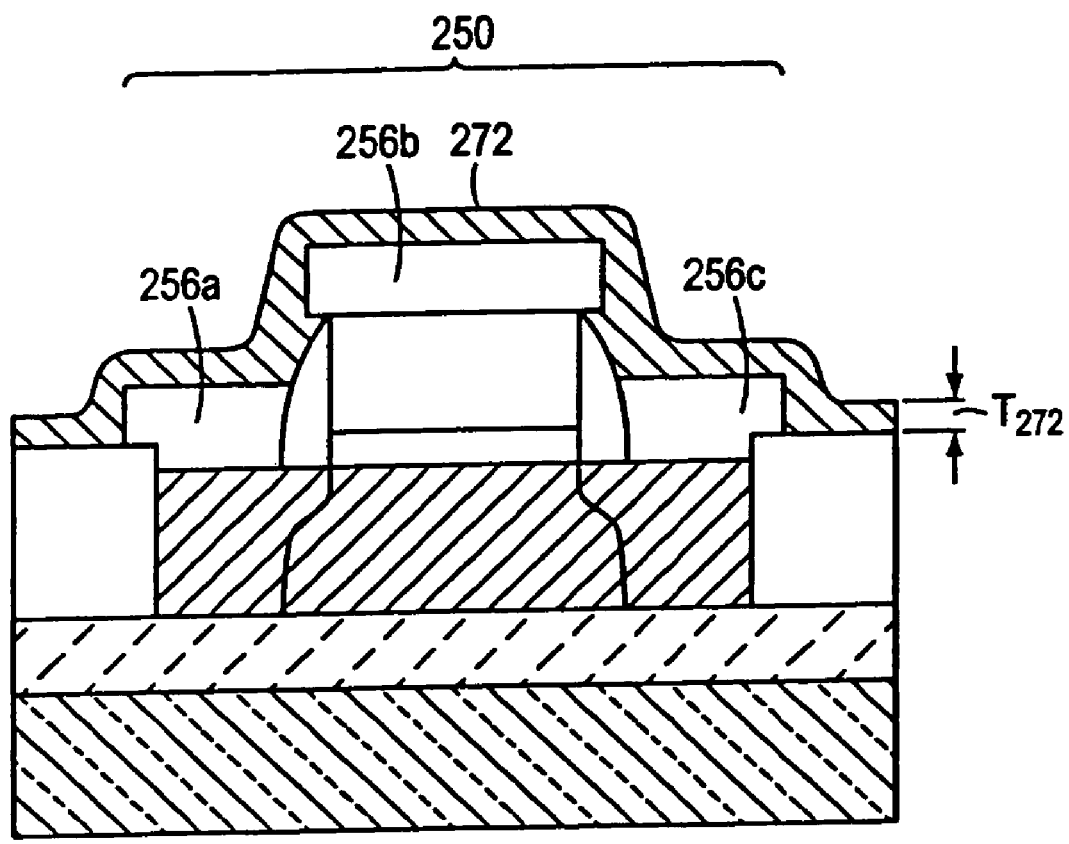

Referring to FIG. 8C, a metal layer 272 is formed over transistor 250. Metal layer 272 is formed by, for example, sputter deposition. Metal layer 272 has a thickness $T_{272}$ of, e.g., 50-200 Å and includes a metal such as cobalt, titanium, tungsten, nickel, or platinum. The metal is selected to react with semiconductor layer 256a-256c to form a low-resistance metal-semiconductor alloy when exposed to heat, as described below. The metal is also selected such that the metal-semiconductor alloy remains stable at temperatures typically required to complete transistor 250 fabrication, e.g., 400-700° C.

Figure 8D:
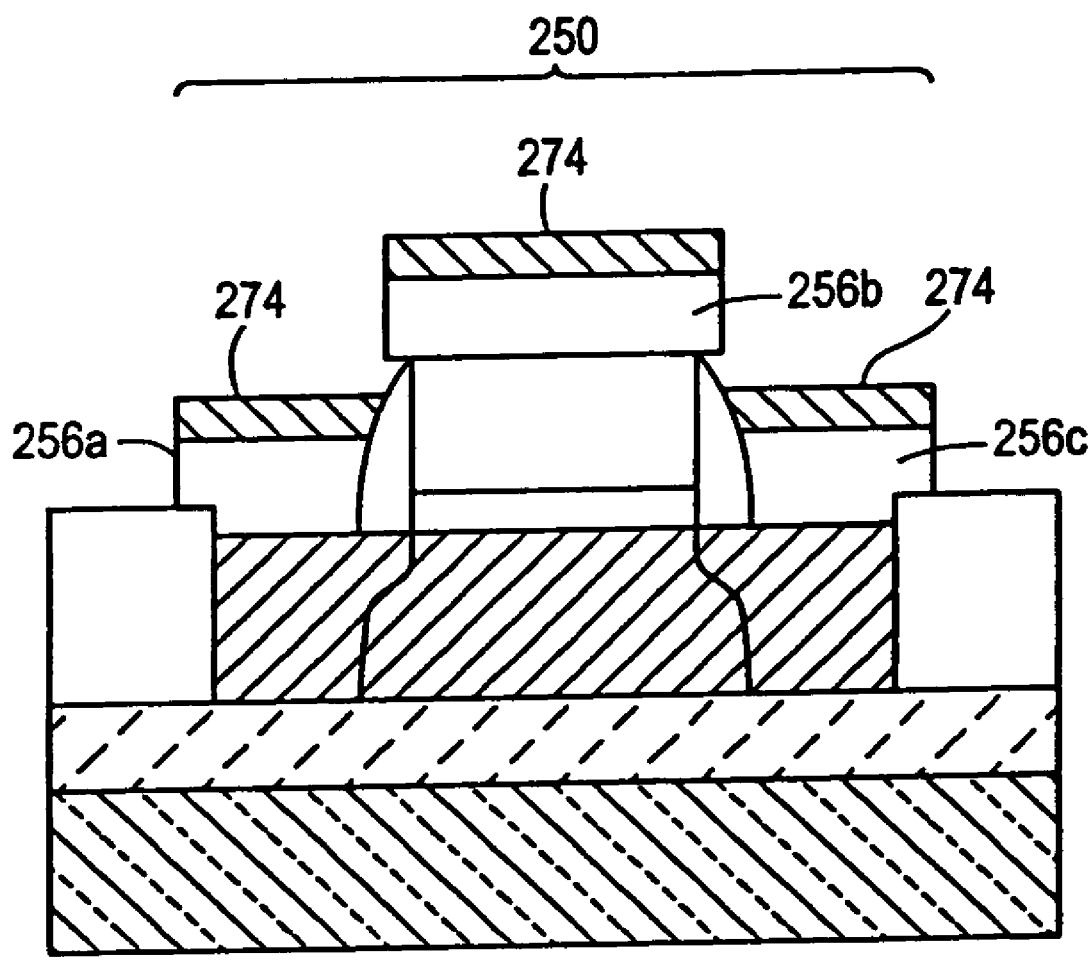

Referring also to FIG. 8D, subsequent to deposition of metal layer 272, a first rapid thermal anneal is performed, e.g., at 550° C. for 60 seconds. This heating step initiates a reaction between metal layer 272 and semiconductor layers 256a-256c, forming a high resistivity phase of a metal-semiconductor alloy, e.g., cobalt silicide (CoSi). Portions of metal layer 272 are removed by a wet etch, such as sulfuric acid and hydrogen peroxide. In an alternative embodiment, the wet etch may be ammonium hydroxide, peroxide, and water. This wet etch removes portions of metal layer 272 disposed over dielectric material, such as over first and second sidewall spacers 252, 254 and isolation regions 268, 270. Portions 274 of metal layer 272 disposed over semiconductor layer 256a-256c that have reacted to form the metal-semiconductor alloy remain in place after the anneal and wet etch.

Figure 8E:
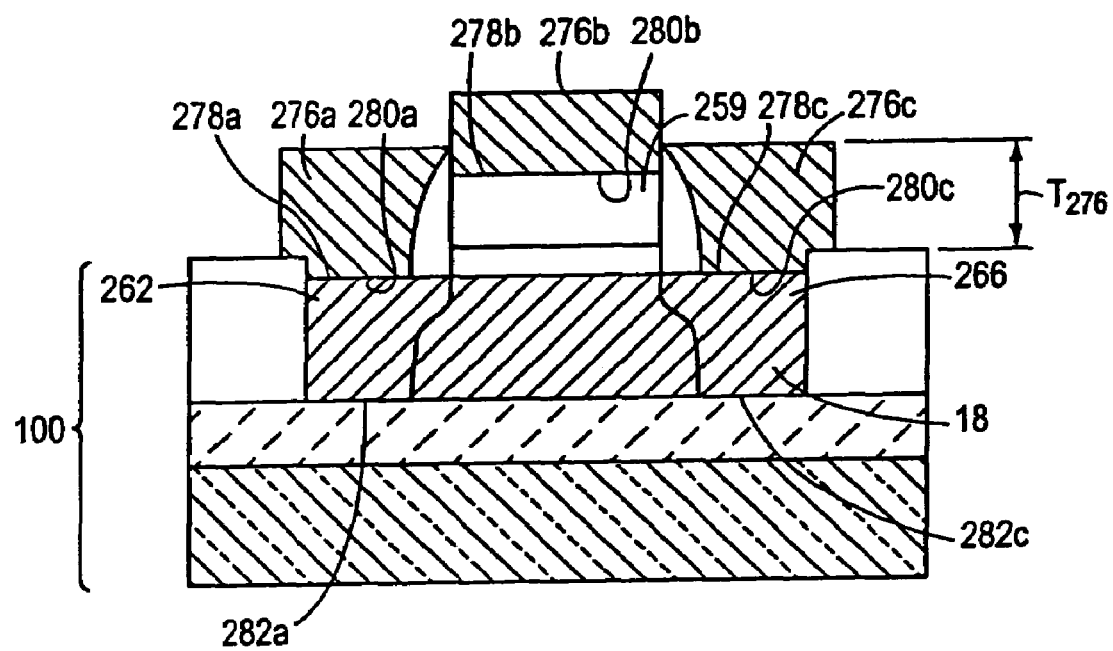

Referring to FIG. 8E, SSOI substrate 100, including transistor 250, is subjected to a second heat treatment. For example, in an embodiment in which metal layer 272 includes cobalt, SSOI substrate 100 undergoes a rapid thermal anneal at 800° C. for 60 seconds in a nitrogen ambient. This heating step initiates a reaction in the metal-semiconductor alloy layer which substantially lowers its resistivity, to form a substantially homogeneous contact layer 276a-276c. Contact layer 276a-276c includes a metal-semiconductor alloy, e.g., a metal silicide such as a low resistivity phase of cobalt silicide ($CoSi_2$). Contact layer 276a-276c has a thickness $T_{276}$ of, for example, 400 Å. Contact layer 276a-276c has a low sheet resistance, e.g., less than about 10 Ω/☐, and enables a good quality contact to be made to source 262 and drain 266, as well as to gate 259.

In some embodiments, during formation, contact layer 276a-276c may consume substantially all of semiconductor layer 256a-256c. A bottommost boundary 278a of contact layer 276a, therefore, shares an interface 280a with strained layer 18 in source 262, and a bottommost boundary 278c of contact layer 276c, therefore, shares an interface 280c with strained layer 18 in drain 266. A bottommost boundary 278b of contact layer 276b shares an interface 280b with gate 259.

In other embodiments, contact layer portions 276a, 276c, disposed over source 262 and drain 266, may extend into strained layer 18. Interfaces 280a, 280c between contact layer 276a, 276c and strained layer 18 are then disposed within source 262 and drain 266, respectively, above bottommost boundaries 282a, 282c of strained layer 18. Interfaces 280a, 280c have a low contact resistivity, e.g., less than approximately $5 \times 10^{-7}$ Ω-$cm^2$. In certain other embodiments, during formation, contact layer 276a-276c may not consume all of semiconductor layer 256a-256c (see FIG. 8D). A bottommost boundary 278a of contact layer 276a, therefore, shares an interface with semiconductor layer 256a over source 262, and a bottommost boundary 278c of contact layer 276c, therefore, shares an interface with semiconductor layer 256c over drain 266.

Because strained layer 18 includes a strained material, carrier mobilities in strained layer 18 are enhanced, facilitating lower sheet resistances. This strain also results in a reduced energy bandgap, thereby lowering the contact resistivity between the metal-semiconductor alloy and the strained layer.

Figure 9:
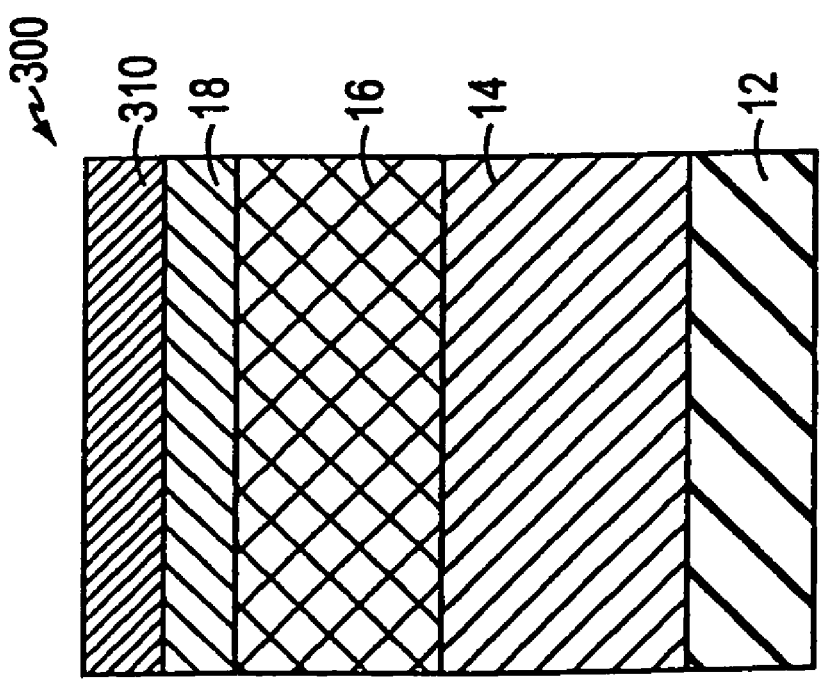

In alternative embodiments, an SSOI structure may include, instead of a single strained layer, a plurality of semiconductor layers disposed on an insulator layer. For example, referring to FIG. 9, epitaxial wafer 300 includes strained layer 18, relaxed layer 16, graded layer 14, and substrate 12. In addition, a semiconductor layer 310 is disposed over strained layer 18. Strained layer 18 may be tensilely strained and semiconductor layer 310 may be compressively strained. In an alternative embodiment, strained layer 18 may be compressively strained and semiconductor layer 310 may be tensilely strained. Strain may be induced by lattice mismatch with respect to an adjacent layer, as described above, or mechanically. For example, strain may be induced by the deposition of overlayers, such as $Si_3N_4$. In another embodiment, semiconductor layer 310 is relaxed. Semiconductor layer 310 includes a semiconductor material, such as at least one of a group II, a group III, a group IV, a group V, and a group VI element. Epitaxial wafer 300 is processed in a manner analogous to the processing of epitaxial wafer 8, as described with reference to FIGS. 1-7.

Figure 10:
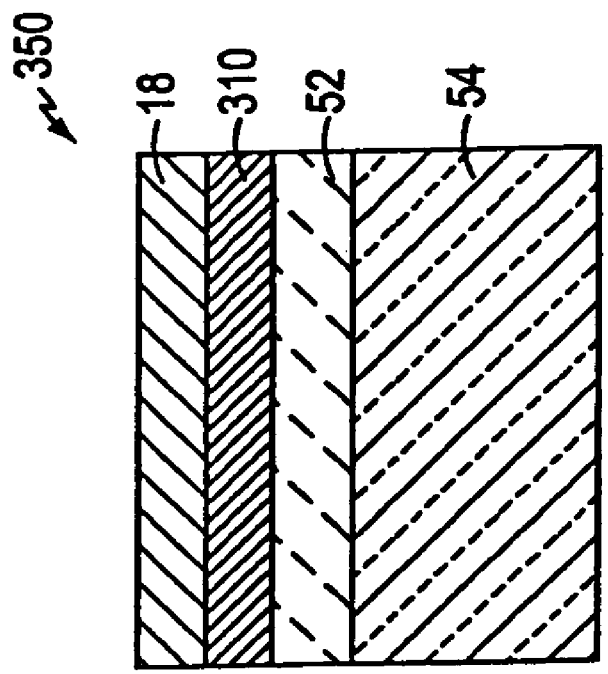
FIGS. 9-10 are schematic cross-sectional views of substrate(s) illustrating a method for fabricating an alternative SSOI substrate.

Referring also to FIG. 10, processing of epitaxial wafer 300 results in the formation of SSOI substrate 350, having strained layer 18 disposed over semiconductor layer 310. Semiconductor layer 310 is bonded to dielectric layer 52, disposed over substrate 54. As noted above with reference to FIG. 9, strained layer 18 may be tensilely strained and semiconductor layer 310 may be compressively strained. Alternatively, strained layer 18 may be compressively strained and semiconductor layer 310 may be tensilely strained. In some embodiments, semiconductor layer 310 may be relaxed.

Figure 11:
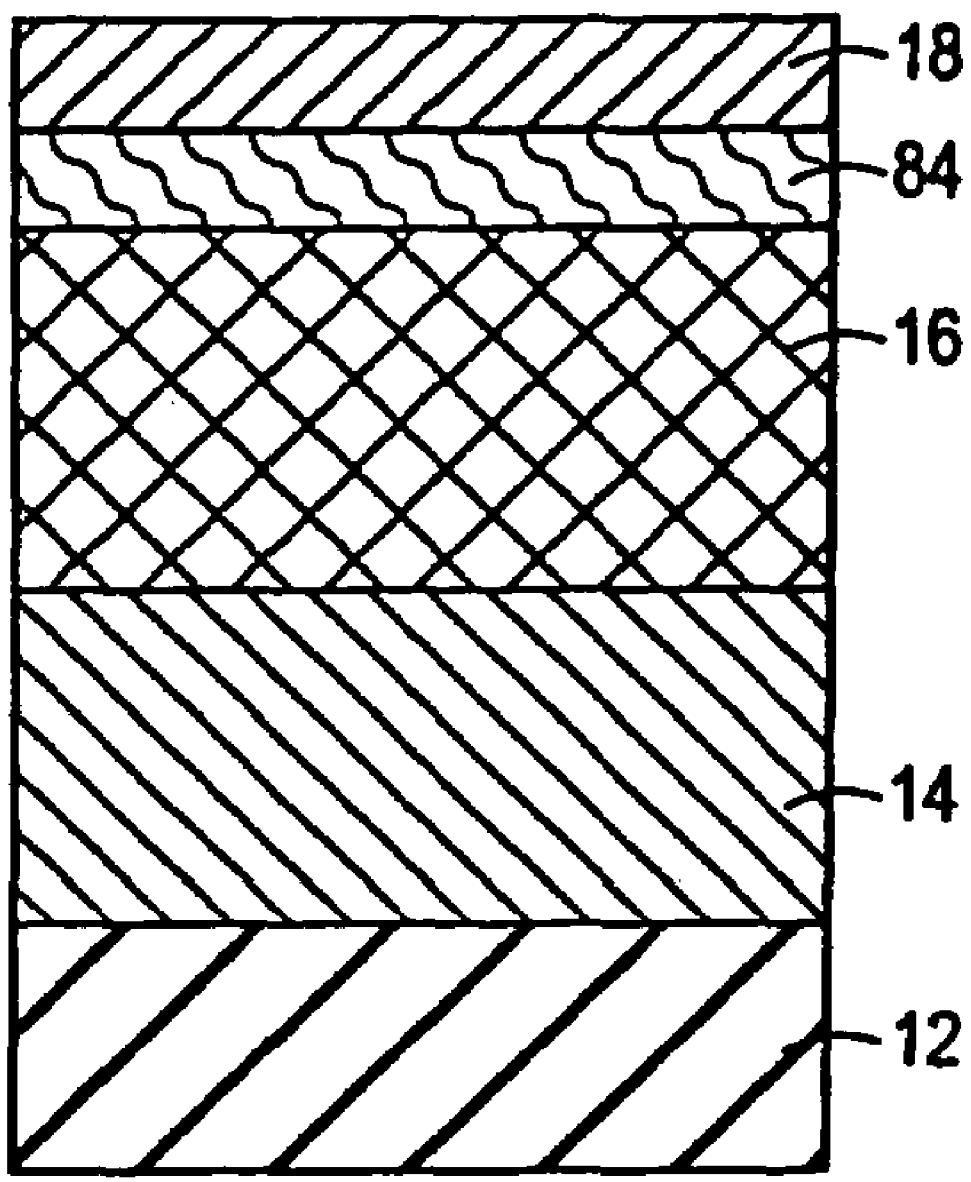
FIG. 11 is a schematic cross-sectional view of a substrate having several layers formed thereon.

Referring to FIG. 11, in some embodiments, a thin strained layer 84 may be grown between strained layer 18 and relaxed layer 16 to act as an etch stop during etching, such as wet etching. In an embodiment in which strained layer 18 includes Si and relaxed layer 16 includes $Si_{1-y}Ge_y$, thin strained layer 84 may include $Si_{1-x}Ge_x$, with a higher Ge content (x) than the Ge content (y) of relaxed layer 16, and hence be compressively strained. For example, if the composition of the relaxed layer 16 is 20% Ge ($Si_{0.80}Ge_{0.20}$), thin strained layer 84 may contain 40% Ge ($Si_{0.60}Ge_{0.40}$) to provide a more robust etch stop. In other embodiments, a second strained layer, such as thin strained layer 84 with higher Ge content than relaxed layer 16, may act as a preferential cleave plane in the hydrogen exfoliation/cleaving procedure described above.

In an alternative embodiment, thin strained layer 84 may contain $Si_{1-x}Ge_x$ with lower Ge content than relaxed layer 16. In this embodiment, thin strained layer 84 may act as a diffusion barrier during the wet oxidation process. For example, if the composition of relaxed layer 16 is 20% Ge ($Si_{0.80}Ge_{0.20}$), thin strained layer 84 may contain 10% Ge ($Si_{0.90}Ge_{0.10}$) to provide a barrier to Ge diffusion from the higher Ge content relaxed layer 16 during the oxidation process. In another embodiment, thin strained layer 84 may be replaced with a thin graded $Si_{1-z}Ge_z$ layer in which the Ge composition (z) of the graded layer is decreased from relaxed layer 16 to the strained layer 18.

Referring again to FIG. 7, in some embodiments, a small amount, e.g., approximately 20-100 Å, of strained layer 18 may be removed at an interface 105 between strained layer 18 and relaxed layer portion 80. This may be achieved by overetching after relaxed layer portion 80 is removed. Alternatively, this removal of strained layer 18 may be performed by a standard microelectronics clean step such as an RCA SC1, i.e., hydrogen peroxide, ammonium hydroxide, and water ($H_2O_2+NH_4OH+H_2O$), which at, e.g., 80° C. may remove silicon. This silicon removal may remove any misfit dislocations that formed at the original strained layer 18/relaxed layer 80 interface 105 if strained layer 18 was grown above the critical thickness. The critical thickness may be defined as the thickness of strained layer 18 beyond which it becomes energetically favorable for the strain in the layer to partially relax via the introduction of misfit dislocations at interface 105 between strained layer 18 and relaxed layer 16. Thus, the method illustrated in FIGS. 1-7 provides a technique for obtaining strained layers above a critical thickness without misfit dislocations that may compromise the performance of deeply scaled MOSFET devices.

Figure 12:
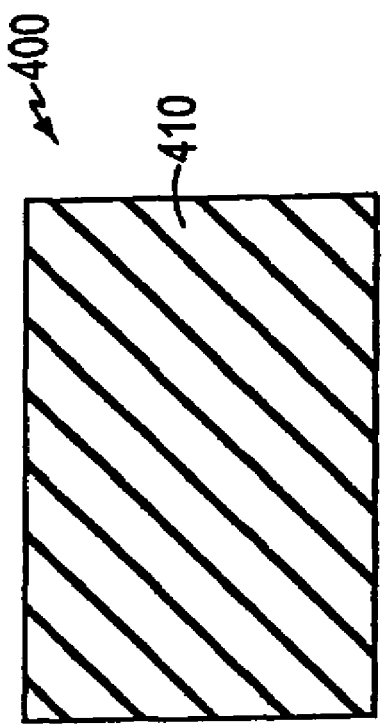

Referring to FIG. 12, in some embodiments, handle wafer 50 may have a structure other than a dielectric layer 52 disposed over a semiconductor substrate 54. For example, a bulk relaxed substrate 400 may comprise a bulk material 410 such as a semiconductor material, e.g., bulk silicon. Alternatively, bulk material 410 may be a bulk dielectric material, such as $Al_2O_3$ (e.g., alumina or sapphire) or $SiO_2$ (e.g., quartz). Epitaxial wafer 8 may then be bonded to handle wafer 400 (as described above with reference to FIGS. 1-6), with strained layer 18 being bonded to the bulk material 410 comprising handle wafer 400. In embodiments in which bulk material 410 is a semiconductor, to facilitate this semiconductor-semiconductor bond, a hydrophobic clean may be performed, such as an HF dip after an RCA SC1 clean.

Figure 13:
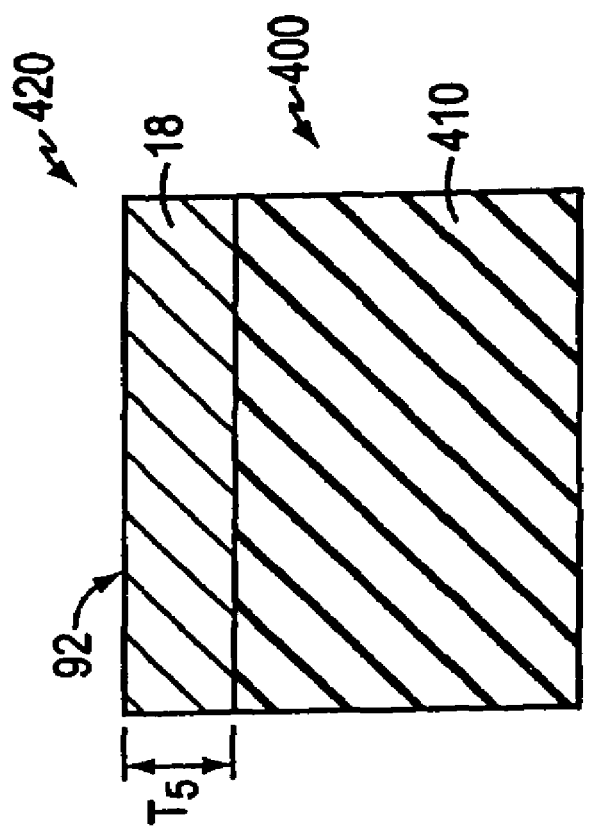
FIGS. 12-13 are schematic cross-sectional views of substrates illustrating a method for fabricating an alternative strained semiconductor substrate.

Referring to FIG. 13, after bonding and further processing (as described above), a strained-semiconductor-on-semiconductor (SSOS) substrate 420 is formed, having strained layer 18 disposed in contact with relaxed substrate 400. The strain of strained layer 18 is not induced by underlying relaxed substrate 400, and is independent of any lattice mismatch between strained layer 18 and relaxed substrate 400. In an embodiment, strained layer 18 and relaxed substrate 400 include the same semiconductor material, e.g., silicon. Relaxed substrate 400 may have a lattice constant equal to a lattice constant of strained layer 18 in the absence of strain. Strained layer 18 may have a strain greater than approximately $1\times10^{-3}$. Strained layer 18 may have been formed by epitaxy, and may have a thickness $T_5$ of between approximately 20 Å-1000 Å, with a thickness uniformity of better than approximately 10%. In an embodiment, strained layer 18 may have a thickness uniformity of better than approximately ±5%. Surface 92 of strained layer 18 may have a surface roughness of less than 20 Å.

Figure 14:
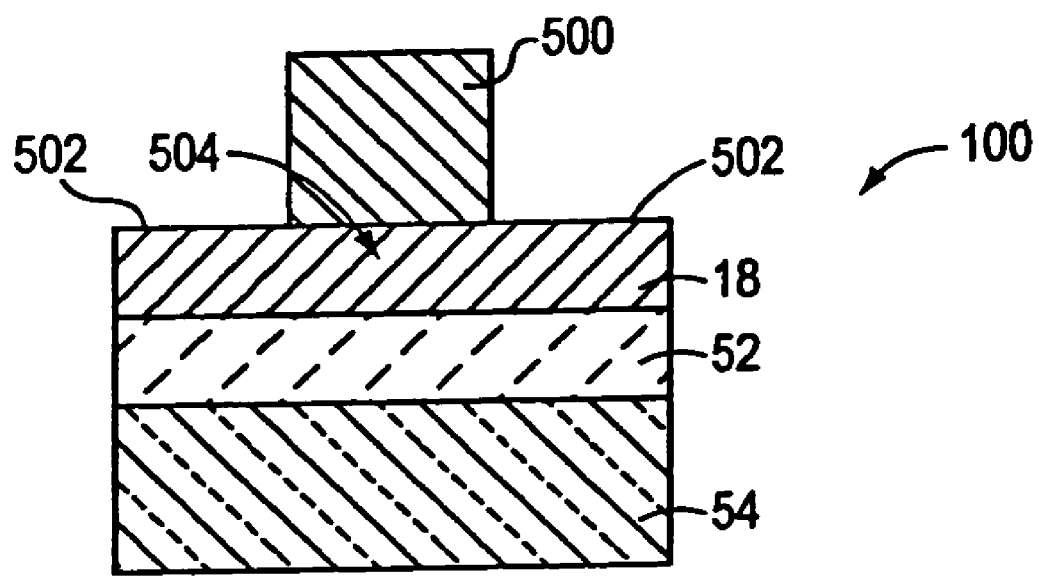
FIG. 14 is a schematic cross-sectional view of the SSOI substrate illustrated in FIG. 6 after additional processing.

Referring to FIG. 14, in an embodiment, after fabrication of the SSOI structure 100 including semiconductor substrate 54 and dielectric layer 52, it may be favorable to selectively relax the strain in at least a portion of strained layer 18. This could be accomplished by introducing a plurality of ions by, e.g., ion implantation after a photolithography step in which at least a portion of the structure is masked by, for example, a photoresist feature 500. Ion implantation parameters may be, for example, an implant of Si ions at a dose of $1\times10^{13}$-$1\times10^{17}$ ions/cm$^2$, at an energy of 5-75 keV. After ion implantation, a relaxed portion 502 of strained layer 18 is relaxed, while a strained portion 504 of strained layer 18 remains strained.

Figure 15A:
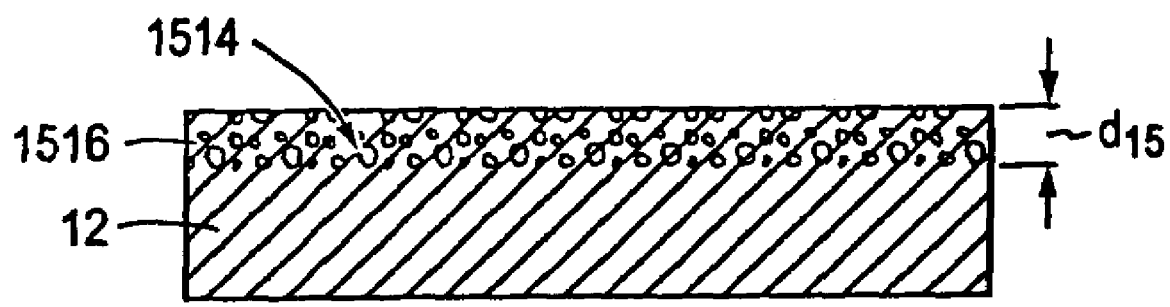
FIGS. 15A-16D are schematic cross-sectional views of substrates illustrating alternative methods for fabricating an SSOI substrate.

Referring to FIGS. 15A-15E, SSOI structure 100 (see FIG. 6) may be formed by the use of a porous semiconductor substrate. Referring to FIG. 15A, substrate 12 may be formed of a semiconductor, such as Si, Ge, or SiGe. A plurality of pores 1514, i.e., microvoids, are formed to define a porous layer 1516 in a portion of substrate 12. Pores 1514 may have a median diameter of 5-10 nm and a pitch of 10-50 nm. Porous layer 1516 may have a porosity of 10-50% and may extend a depth of $d_{15}$ into substrate 12 of approximately 1-5 μm.

Figure 15B:
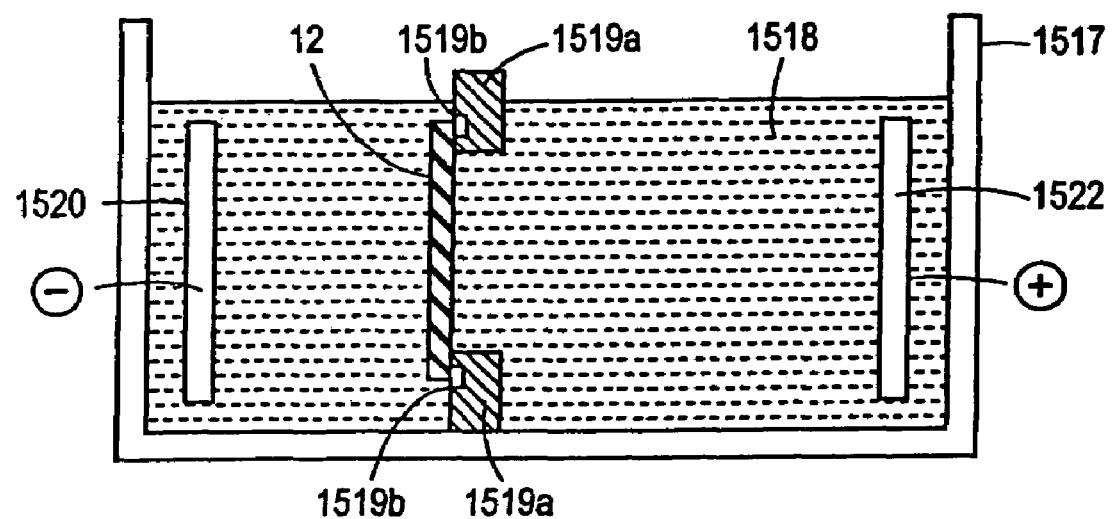

Referring to FIG. 15B, pores 1514 may be formed by, for example, submerging substrate 12 into a vessel 1517 containing an electrolyte 1518, such as hydrofluoric acid (HF), possibly mixed with ethanol, with a cathode 1520 and an anode 1522 disposed in the electrolyte 1518. A back surface chucking holder 1519a with a vacuum pad 1519b may hold substrate 12 while it is submerged in vessel 1517. A current may be generated between cathode 1520 and anode 1522, through substrate 12, resulting in the electrochemical etching of substrate 12, thereby forming pores 1514 at a top surface 1524 of substrate 12. In an embodiment, prior to the formation of pores 1514, substrate 12 may be planarized, e.g., by CMP.

Figure 15C:
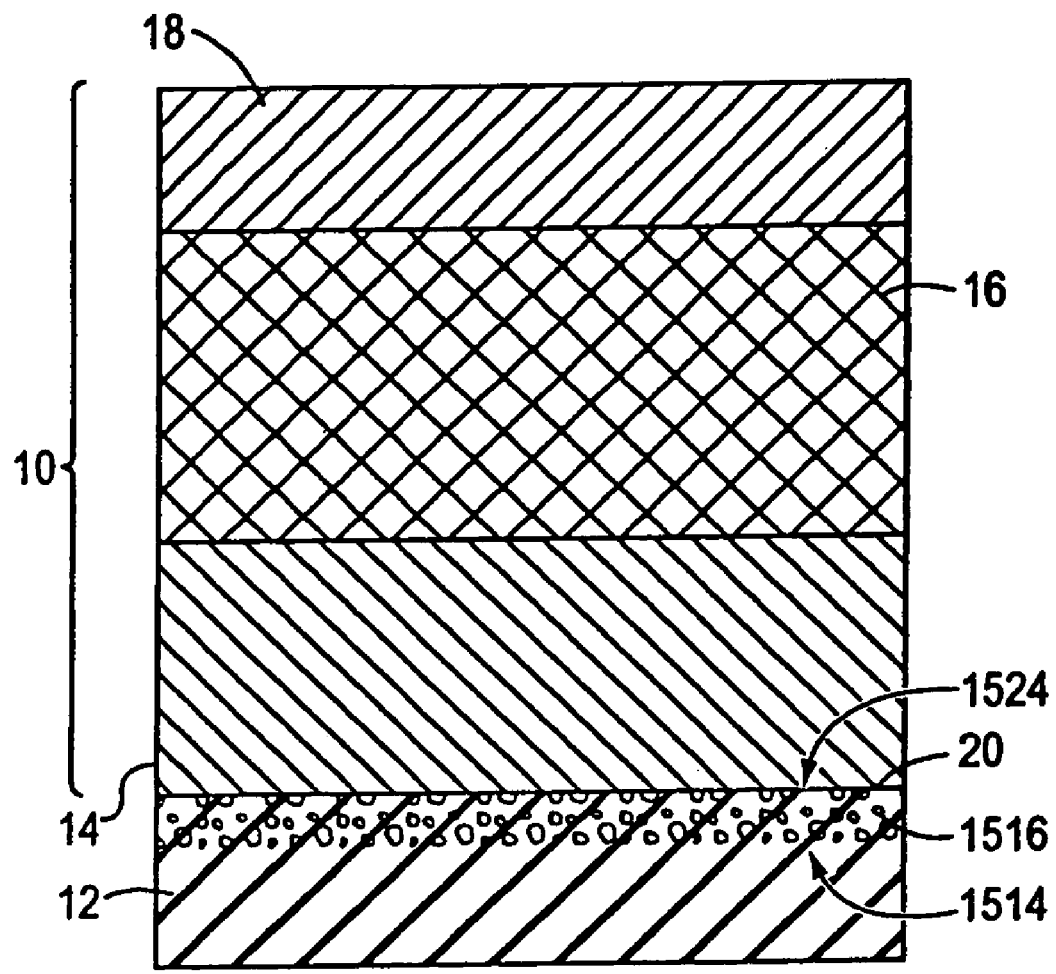

Referring to FIG. 15C, after the formation of pores 1514, a plurality of layers 10 may be formed over porous top surface 1524 of substrate 12, as described with reference to FIG. 1A. Layers 10 may include, for example, graded buffer layer 14, relaxed layer 16, and strained layer 18. Pores 1514 define cleave plane 20 in porous layer 1516 of substrate 12.

Figure 15D:
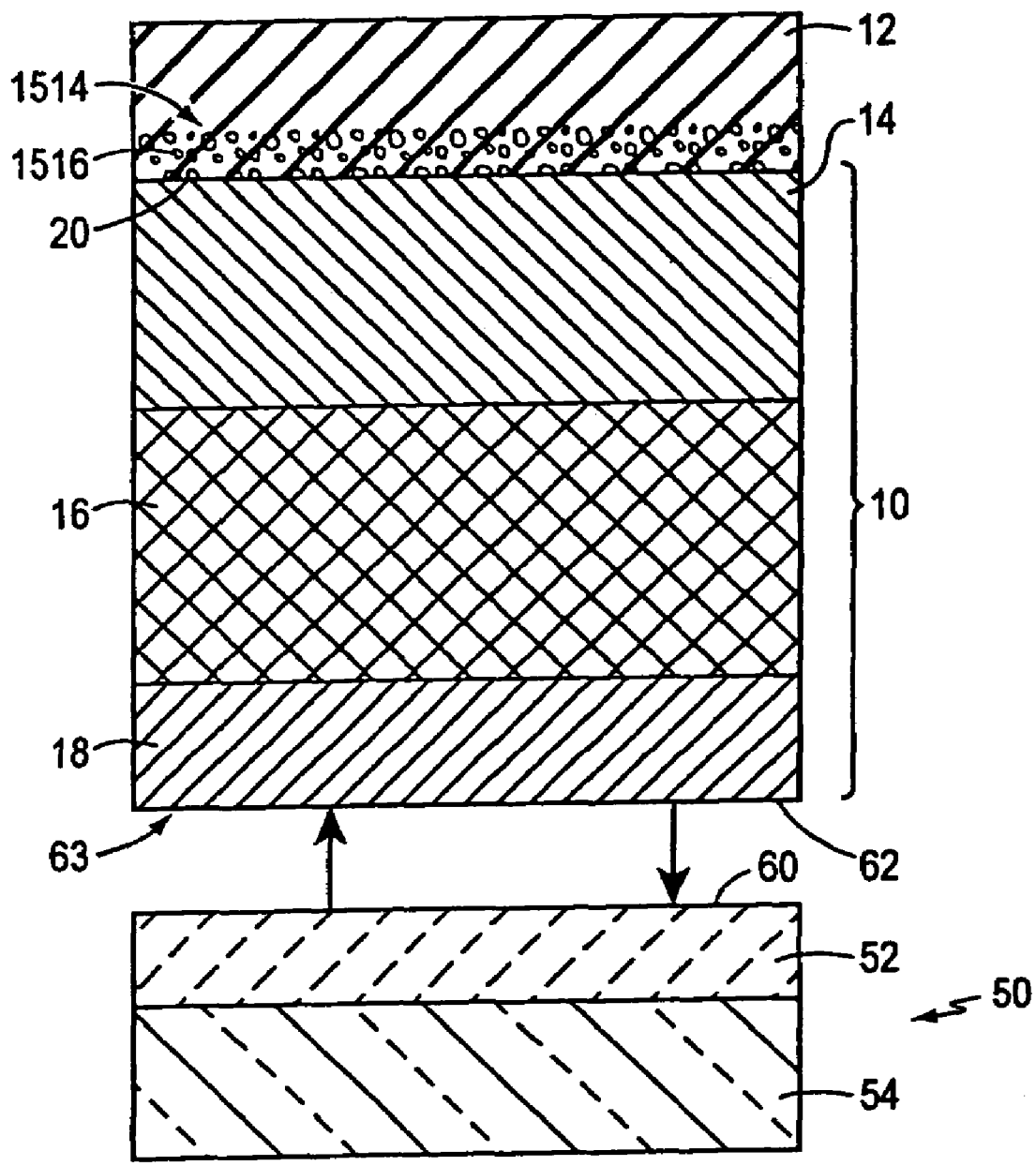

Referring to FIG. 15D, substrate 12 with layers 10 is bonded to handle wafer 50, including semiconductor substrate 54 and dielectric layer 52, as described with reference to FIG. 3. Prior to bonding, a dielectric layer may be formed on a top surface of layers 10 to facilitate the bonding process and to serve as an insulator layer in the final substrate structure.

Figure 15E:
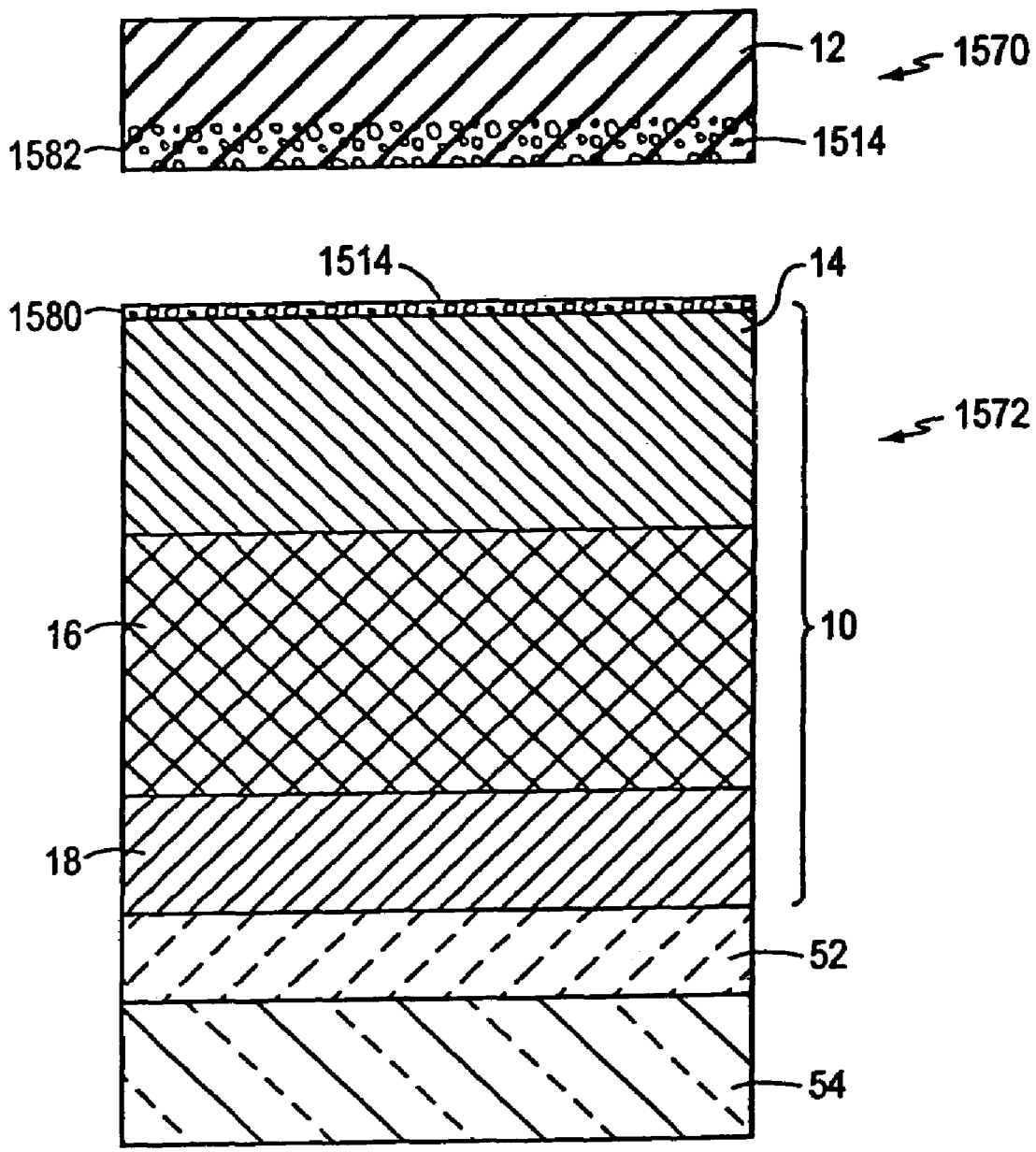

Referring to FIG. 15E as well as to FIG. 15D, a split is induced at cleave plane 20 by, for example, cleaving porous layer 1516 by a water or an airjet. The split results in the formation of two separate wafers 1570, 1572. One of these wafers (1572) has graded layer 14 and relaxed layer 16 (see FIG. 15C) disposed over strained layer 18, with a first portion 1580 of substrate 12 disposed over graded layer 14. First portion 1580 of substrate 12 may be just trace amounts of material surrounding pores 1514. Strained layer 18 is in contact with dielectric layer 52 on semiconductor substrate 54. The other of these wafers (1570) includes a second portion 1582 of substrate 12, including the bulk of substrate 12 with perhaps trace amounts of material surrounding pores 1514.

Referring to FIG. 6 as well as to FIG. 15E, first portion 1580 of substrate 12 is removed from graded layer 14 by a wet chemical cleaning process utilizing, for example a mixture of hydrogen peroxide ($H_2O_2$) and HF. Graded layer 14 and relaxed layer 16 are removed in any one of the methods described for the removal of relaxed layer portion 80 with reference to FIGS. 4 and 5. Removal of graded and relaxed layers 14, 16 results in the formation of SSOI substrate 100.

Figure 16A:
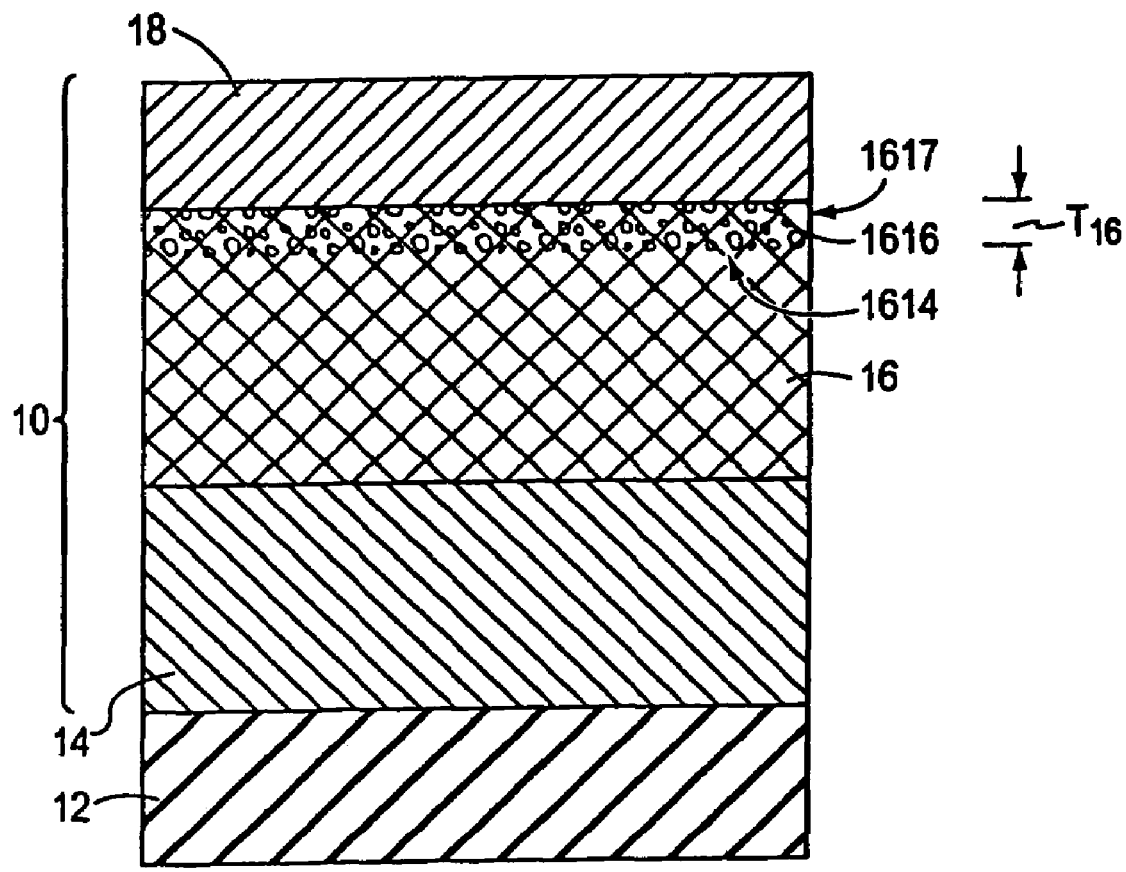

Referring to FIG. 16A, SSOI substrate 100 (see FIG. 6) may also be formed by the use of porous intermediate layers. For example, plurality of layers 10 may be formed over substrate 12, layers 10 including graded layer 14, relaxed layer 16, and strained layer 18 (see FIG. 1A). Prior to the formation of strained layer 18, a plurality of pores 1614 may be formed in a top portion of relaxed layer 16, thereby defining a porous layer 1616 in a top portion 1617 of relaxed layer 16. Pores 1614 may be formed by the methods described above with reference to the formation of pores 1514 in FIG. 15B. Porous layer 1616 may have a thickness $T_{16}$ of, e.g., 1-5 μm. Strained layer 18 may then be formed directly over porous layer 1616. Pores 1614 define cleave plane 20 in porous layer 1616.

Figure 16B:
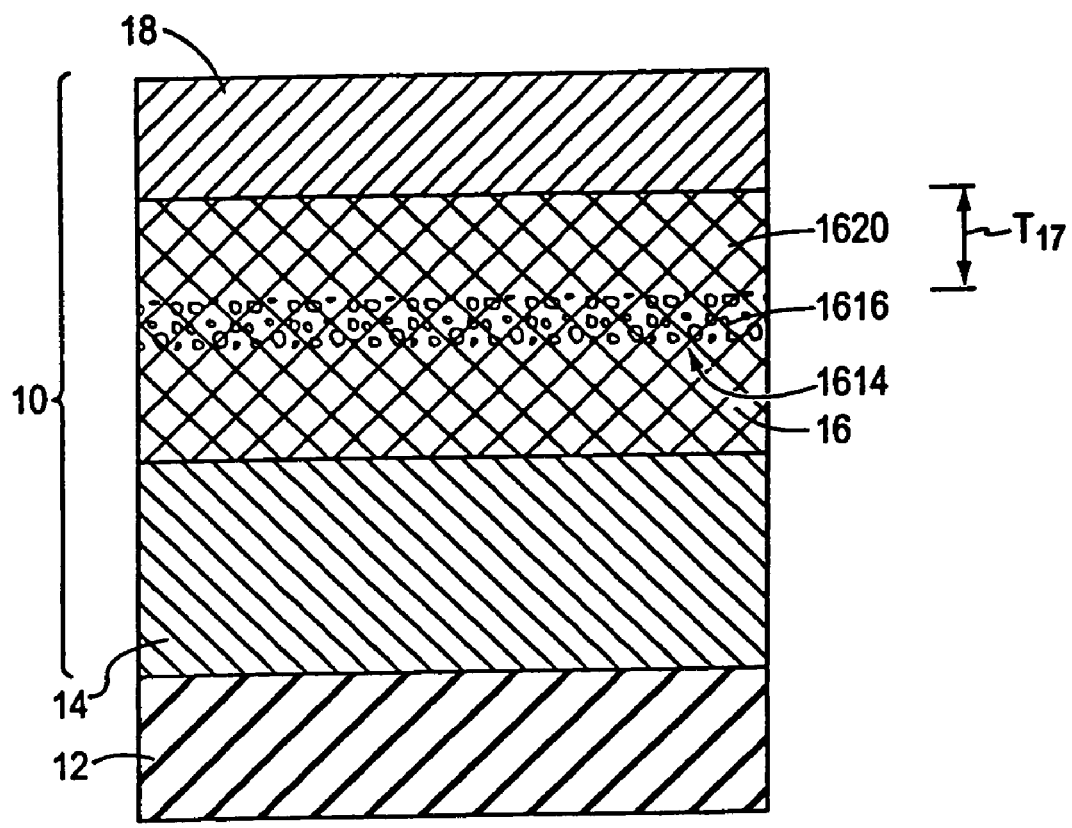

Referring to FIG. 16B, in an alternative embodiment, after the formation of porous layer 1616 in a portion of relaxed layer 16, a second relaxed layer 1620 may be formed over relaxed layer 16 including porous layer 1616. Second relaxed layer 1620 may include the same material from which relaxed layer 16 is formed, e.g., uniform $Si_{1-x}Ge_x$ having a Ge content of, for example, 10-80% (i.e., x=0.1-0.8) and having a thickness $T_{17}$ of, e.g., 5-100 nm. In some embodiments, $Si_{1-x}Ge_x$ may include $Si_{0.70}Ge_{0.30}$ and $T_{17}$ may be approximately 50 nm. Second relaxed layer 1620 may be fully relaxed, as determined by triple axis X-ray diffraction, and may have a threading dislocation density of <$1\times10^6$/cm$^2$, as determined by etch pit density (EPD) analysis. Strained layer 18 may be formed over second relaxed layer 1620. Pores 1614 define cleave plane 20 in porous layer 1616.

Figure 16C:
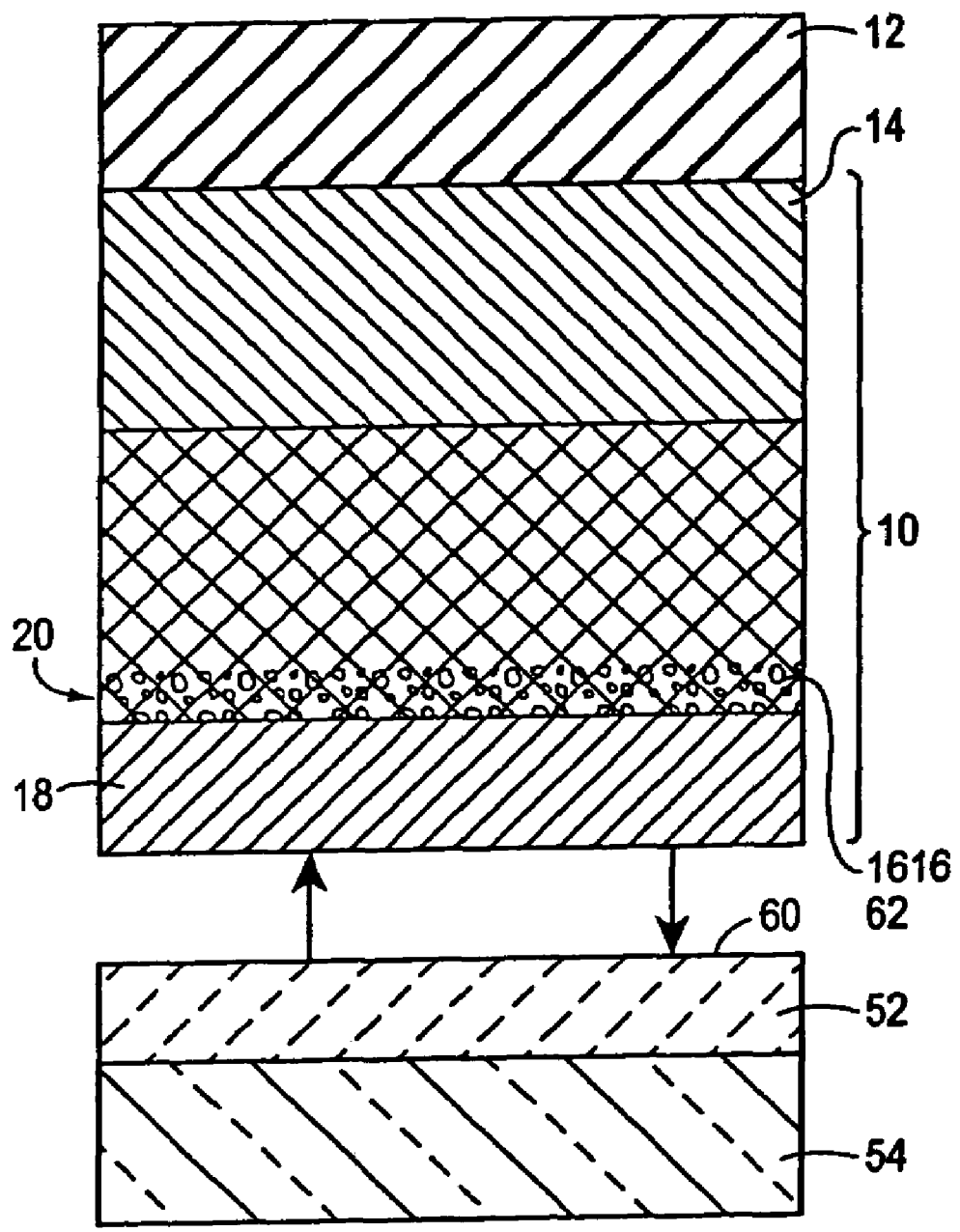

Referring to FIG. 16C, substrate 12 with layers 10 is bonded to handle wafer 50, including semiconductor substrate 54 and dielectric layer 52, as described with reference to FIG. 3.

Figure 16D:
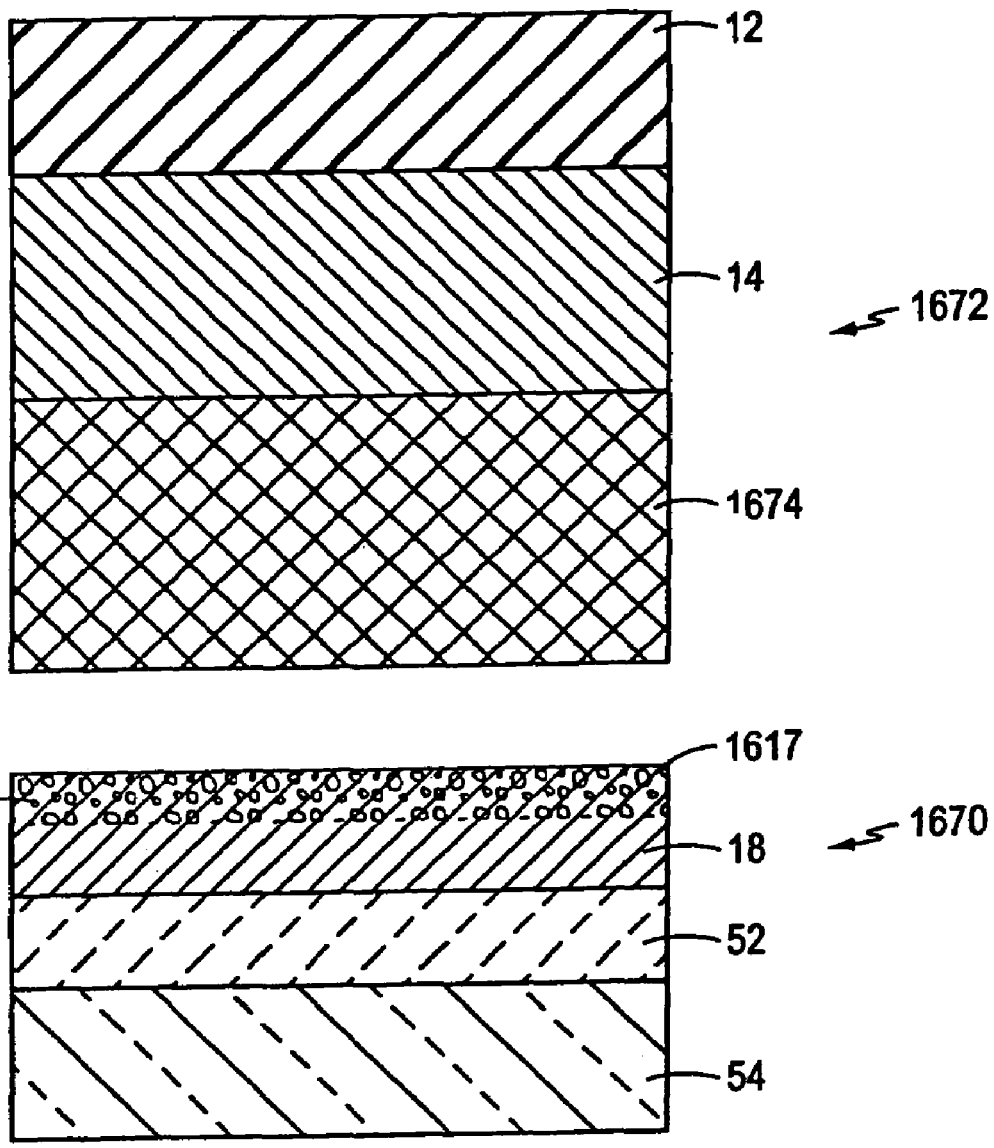

Referring to FIG. 16D as well as to FIG. 16C, a split is induced at cleave plane 20 by, for example, cleaving porous layer 1616 by a water or an air jet. The split results in the formation of two separate wafers 1670, 1672. One of these wafers (1670) has top portion 1617 of relaxed layer 16 (see FIG. 16A) disposed over strained layer 18. Strained layer 18 is in contact with dielectric layer 52 on semiconductor substrate 54. The other of these wafers (1672) includes the substrate 12, graded layer 14, and a bottom portion 1674 of relaxed layer 16.

Referring to FIG. 6 as well as to FIG. 16D, top portion 1617 of relaxed layer 16 is removed in any one of the methods described for the removal of relaxed layer portion 80 with reference to FIGS. 4 and 5. Removal of top portion 1617 of relaxed layer 16 results in the formation of SSOI substrate 100.

The bonding of strained silicon layer 18 to dielectric layer 52 has been experimentally demonstrated. For example, strained layer 18 having a thickness of 54 nanometers (nm) along with ~350 nm of $Si_{0.70}Ge_{0.30}$ have been transferred by hydrogen exfoliation to Si handle wafer 50 having dielectric layer 52 formed from thermal $SiO_2$ with a thickness of approximately 100 nm. The implant conditions were a dose of $4 \times 10^{16}$ ions/cm$^3$ of $H_2^+$ at 75 keV. The anneal procedure was 1 hour at 550° C. to split the SiGe layer, followed by a 1 hour, 800° C. strengthening anneal. The integrity of strained Si layer 18 and good bonding to dielectric layer 52 after layer transfer and anneal were confirmed with cross-sectional transmission electron microscopy (XTEM). An SSOI structure 100 was characterized by XTEM and analyzed via Raman spectroscopy to determine the strain level of the transferred strained Si layer 18. An XTEM image of the transferred intermediate SiGe/strained Si/SiO$_2$ structure showed transfer of the 54 nm strained Si layer 18 and ~350 nm of the $Si_{0.70}Ge_{0.30}$ relaxed layer 16. Strained Si layer 18 had a good integrity and bonded well to $SiO_2$ 54 layer after the annealing process.

XTEM micrographs confirmed the complete removal of relaxed SiGe layer 16 after oxidation and HF etching. The final structure includes strained Si layer 18 having a thickness of 49 nm on dielectric layer 52 including $SiO_2$ and having a thickness of 100 nm.

Raman spectroscopy data enabled a comparison of the bonded and cleaved structure before and after SiGe layer 16 removal. Based on peak positions the compostion of the relaxed SiGe layer and strain in the Si layer may be calculated. See, for example, J. C. Tsang, et al., J. Appl. Phys. 75 (12) p. 8098 (1994), incorporated herein by reference. The fabricated SSOI structure 100 had a clear strained Si peak visible at ~511/cm. Thus, the SSOI structure 100 maintained greater than 1% tensile strain in the absence of the relaxed SiGe layer 16. In addition, the absence of Ge—Ge, Si—Ge, and Si—Si relaxed SiGe Raman peaks in the SSOI structure confirmed the complete removal of SiGe layer 16.

In addition, the thermal stability of the strained Si layer was evaluated after a 3 minute 1000° C. rapid thermal anneal (RTA) to simulate an aggregate thermal budget of a CMOS process. A Raman spectroscopy comparision was made of SSOI structure 100 as processed and after the RTA step. A scan of the as-bonded and cleaved sample prior to SiGe layer removal was used for comparision. Throughout the SSOI structure 100 fabrication processs and subsequent anneal, the strained Si peak was visible and the peak position did not shift. Thus, the strain in SSOI structure 100 was stable and was not diminished by thermal processing. Furthermore, bubbles or flaking of the strained Si surface 18 were not observed by Nomarski optical microscopy after the RTA, indicating good mechanical stability of SSOI structure 100.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A method for forming a structure, the method comprising:
    forming a first strained semiconductor layer over a first substrate to define a layer structure, the layer structure comprising a porous layer defining a cleave plane;
    forming a first relaxed layer over the first substrate;
    planarizing the first relaxed layer;
    forming a second relaxed layer over the first relaxed layer after the first relaxed layer is planarized;
    bonding the first strained semiconductor layer to an insulator layer disposed on a second substrate; and
    removing the first substrate from the first strained semiconductor layer by cleaving at the cleave plane, the strained semiconductor layer remaining bonded to the insulator layer,
    wherein the first relaxed layer includes the porous layer defining a cleave plane; and the first strained semiconductor layer is formed over the first and second relaxed layers.

2. The method of claim 1, wherein planarizing comprises chemical-mechanical polishing.

3. The method of claim 1, wherein the relaxed layer comprises SiGe.

4. A method for forming a structure, the method comprising:
    forming a first strained semiconductor layer over a first substrate to define a layer structure, the layer structure comprising a porous layer defining a cleave plane;
    bonding the first strained semiconductor layer to an insulator layer disposed on a second substrate; and
    removing the first substrate from the first strained semiconductor layer by cleaving at the cleave plane, the strained semiconductor layer remaining bonded to the insulator layer and at least a portion of the porous layer remaining disposed over the first strained semiconductor layer after cleaving; and
    removing the portion of the porous layer after cleaving,
    wherein removing the portion of the porous layer comprises thermal oxidation.

5. A method for forming a structure, the method comprising:
    forming a first relaxed layer over a first substrate;
    thereafter forming a porous layer by forming a plurality of pores in the first relaxed layer to define a cleave plane;
    forming a first strained semiconductor layer over the first substrate and the first relaxed layer to define a layer structure;
    bonding the first strained semiconductor layer to an insulator layer disposed on a second substrate; and
    removing the first substrate from the first strained semiconductor layer by cleaving at the cleave plane, the strained semiconductor layer remaining bonded to the insulator layer.

6. The method of claim 5, wherein the porous layer is disposed at a top portion of the first relaxed layer.

7. The method of claim 5, further comprising:
    forming a second relaxed layer over the first relaxed layer, wherein the strained semiconductor layer is formed over the second relaxed layer.

8. The method of claim 5, wherein at least a portion of the porous layer remains disposed over the first strained semiconductor layer after cleaving.

9. The method of claim 8, further comprising:

removing the portion of the porous layer after cleaving.

10. The method of claim 9, wherein removing the portion of the porous layer comprises cleaning with a wet chemical solution.

11. The method of claim 10, wherein the wet chemical solution comprises hydrogen peroxide.

12. The method of claim 10, wherein the wet chemical solution comprises hydrofluoric acid.

13. The method of claim 5, further comprising forming a dielectric layer above the first strained semiconductor layer prior to bonding.

14. The method of claim 5, wherein the porous layer is formed by electrochemical etching.

15. The method of claim 5, further comprising:

defining a transistor over the second substrate, the transistor including a gate disposed above the first strained semiconductor layer, wherein the gate comprises a material selected from the group consisting of a doped semiconductor, a metal, and a metallic compound.

16. The method of claim 5, wherein the relaxed layer comprises SiGe.

* * * * *